US012638523B2

(12) United States Patent
Nishibayashi et al.

(10) Patent No.: US 12,638,523 B2
(45) Date of Patent: May 26, 2026

(54) DIAMOND SENSOR UNIT AND DIAMOND SENSOR SYSTEM

(71) Applicant: SUMITOMO ELECTRIC INDUSTRIES, LTD., Osaka (JP)

(72) Inventors: Yoshiki Nishibayashi, Osaka (JP); Hiromi Nakanishi, Osaka (JP); Hiroshige Deguchi, Kyoto (JP); Tsukasa Hayashi, Kyoto (JP); Natsuo Tatsumi, Kyoto (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 90 days.

(21) Appl. No.: 18/273,286

(22) PCT Filed: Jan. 26, 2022

(86) PCT No.: PCT/JP2022/002765
§ 371 (c)(1),
(2) Date: Jul. 20, 2023

(87) PCT Pub. No.: WO2022/163678
PCT Pub. Date: Aug. 4, 2022

(65) Prior Publication Data
US 2024/0111008 A1      Apr. 4, 2024

(30) Foreign Application Priority Data

Jan. 27, 2021      (JP) ................................. 2021-010935

(51) Int. Cl.
| | |
|---|---|
| *G01R 33/26* | (2006.01) |
| *G02B 6/32* | (2006.01) |
| *G02B 6/42* | (2006.01) |

(52) U.S. Cl.
CPC ............... *G01R 33/26* (2013.01); *G02B 6/32* (2013.01); *G02B 6/4202* (2013.01)

(58) Field of Classification Search
CPC ........ G02B 6/32; G02B 6/4202; G01R 33/26; G01R 33/00; G01R 33/02; G01R 33/035; G01R 33/096; G01N 27/00
(Continued)

(56) References Cited

U.S. PATENT DOCUMENTS

2015/0299894 A1* 10/2015 Markham ............... C30B 29/04
                                                           423/446
2016/0266220 A1     9/2016 Sushkov et al.
(Continued)

FOREIGN PATENT DOCUMENTS

| CN | 111198344 A | * 5/2020 | ............. G01N 27/72 |
|---|---|---|---|
| CN | 110554332 B | 1/2021 | |

(Continued)

OTHER PUBLICATIONS

Patel et al. Subnanotesla Magnetometry with a Fiber-Coupled Diamond Sensor, Physical Review Applied, 14, 044058 (2020). (Year: 2020).*

(Continued)

*Primary Examiner* — Lee E Rodak
*Assistant Examiner* — Taqi R Nasir
(74) *Attorney, Agent, or Firm* — Renner, Otto, Boisselle & Sklar, LLP

(57) ABSTRACT

A diamond sensor unit includes: a sensor part that includes a diamond having a color center with electron spin; an irradiation part that irradiates the diamond with excitation light; a detection part that detects radiated light from the color center of the diamond; and an optical waveguide that transmits the excitation light, and the radiated light.

16 Claims, 10 Drawing Sheets

(58) Field of Classification Search
USPC .................................................. 324/207, 240
See application file for complete search history.

(56) References Cited

U.S. PATENT DOCUMENTS

| | | | |
|---|---|---|---|
| 2017/0363696 | A1 | 12/2017 | Hahn et al. |
| 2018/0275212 | A1* | 9/2018 | Hahn .................... G01R 33/032 |
| 2019/0285706 | A1* | 9/2019 | Sekelsky .............. G01R 33/032 |
| 2020/0184362 | A1* | 6/2020 | Sukachev ............... G11C 11/16 |
| 2022/0307997 | A1 | 9/2022 | Meijer et al. |

FOREIGN PATENT DOCUMENTS

| | | |
|---|---|---|
| DE | 20 2020 106145 U1 | 12/2020 |
| JP | 2016-505494 A | 2/2016 |
| JP | 2016-539900 A | 12/2016 |
| JP | 2017-67650 A | 4/2017 |
| JP | 2017-146158 A | 8/2017 |
| JP | 2018-136316 A | 8/2018 |
| JP | 2019-211271 A | 12/2019 |
| JP | 2020-8298 A | 1/2020 |
| RU | 190347 U1 | 6/2019 |
| WO | 2014/090662 A1 | 6/2014 |
| WO | 2015/071487 A1 | 5/2015 |

OTHER PUBLICATIONS

Auzinsh, Marcis et al., "Hyperfine level structure in nitrogen-vacancy centers near the ground-state level anticrossing" ARXIV. Org. Cornell University Library, May 3, 2018, 15 pages.
Fedotov, I. V. et al., "High-resolution magnetic field imaging with a nitrogen-vacancy diamond sensor integrated with a photonic-crystal fiber", Optics Letters (online), vol. 41, No. 3, Jan. 25, 2016, 4 pages.
Patel, R. L. et al., "Subnanotesla Magnetometry with a Fiber-Coupled Diamond Sensor", Physical Review Applied, vol. 14, No. 4, Oct. 1, 2020, 10 pages.
Duan, Dewen et al., "Efficient nitrogen-vacancy centers' fluorescence excitation and collection from micrometer-sized diamond by a tapered optical fiber", ARXIV. Org. Cornell University library, Oct. 9, 2018, 11 pages.
Duan, Dewen et al., "Enhancing fluorescence excitation and collection from the nitrogen-vacancy center in diamond through a micro-concave mirror", Applied Physics Letters, vol. 113, No. 4, Jul. 23, 2018, 6 pages.
Kuwahata, Akihiro et al., "Magnetometer with nitrogen-vacancy center in a bulk diamond for detecting magnetic nanoparticles in biomedical applications", Scientific Reports, vol. 10, No. 1, 2020, p. 2483, 9 pages.
Zhang, Shao-Chun et al., "Thermal-demagnetization-enhanced hybrid fiber-based thermometer coupled with nitrogen-vacancy centers", ARXIV. Org. Cornell University library, May 9, 2019, 5 pages.
Zhang, Jixing et al., "Diamond Nitrogen-Vacancy Center Magnetometry: Advances and Challenges", ARXIV. Org. Cornell University library, Oct. 20, 2020, 17 pages.
Arne Wickenbrock, et al., "Microwave-free magnetometry with nitrogen-vacancy centers in diamond", Applied Physics Letters 109, 053505 (2016) (cited in specification).
Felix M. Stuerner, et al., "Compact integrated magnetometer based on nitrogen-vacancy centres in diamond", Diamond & Related Materials 93 (2019) 59-65 (cited in specification).
Yuji Hatano et al., Sensitivity of the diamond quantum sensor in the simultaneous multiple operation point measurement, Proceedings of the 81st JSAP Autumn Meeting (2020) (concise explanation of relevance provided in International Search Report for corresponding Application No. PCT/JP2022/002765, mailed Mar. 22, 2022).
International Search Report for corresponding Application No. PCT/JP2022/002765, mailed Mar. 22, 2022.

* cited by examiner

DIAMOND SENSOR UNIT AND DIAMOND SENSOR SYSTEM

TECHNICAL FIELD

The present disclosure relates to a diamond sensor unit, and a diamond sensor system. The present application claims the priority based on Japanese Patent Application No. 2021-010935 filed on Jan. 27, 2021. The entire description in this Japanese Patent Application is incorporated herein by reference.

BACKGROUND ART

Sensors that use NV centers of diamonds have been known. In a case of using the NV center of a diamond in combination with a microscope, a configuration as shown in FIG. 1 is adopted, for example. That is, an LU) 900 disposed on a substrate 912 emits green light for exciting the NV center of a diamond 904. The emitted light passes through an SPF (Short Pass Filter) 902, and subsequently enters diamond 904 disposed on a substrate 914. Accordingly, electrons at the NV center are brought into an excited state. When the excited electrons return to the original ground state, red fluorescent light is emitted from diamond 904. The fluorescent light is collected by a lens 906, passes through an LPF (Long Pass Filter) 908, and subsequently, is detected by a photodiode 910 disposed on a substrate 916. Diamond 904 is irradiated by microwaves generated by an external device (not shown). Accordingly, a resonant state with a state in a different spin state is achieved, and excitation is made, and thus the intensity of the red fluorescent light from diamond 904 is changed. The change is detected by photodiode 910. Lens 906 may have a lens structure of a high-performance optical microscope, or have a simple lens configuration.

Patent Literature 1 described below discloses a scanning probe microscope that uses the NV center of a diamond (i.e., a frequency modulation atomic force microscope (FM-AFM)). Patent Literature 2 described below discloses a magnetic field detection device that uses the NV center of a diamond. Non Patent Literature 2 described below discloses a compact magnetic field detection device that includes a lens.

CITATION LIST

Patent Literature

PTL 1: Japanese Patent Laying-Open No. 2017-67650
PTL 2: Japanese Patent Laying-Open No. 2018-136316

Non Patent Literature

NPL 1: Arne Wickenbrock, et al., "Microwave-free magnetometry with nitrogen-vacancy centers in diamond", Applied Physics Letters 109, 053505 (2016)
NPL 2: Felix M. Stuerner, et al., "Compact integrated magnetometer based on nitrogen-vacancy centres in diamond", Diamond & Related Materials 93 (2019) 59-65

SUMMARY OF INVENTION

A diamond sensor unit according to an aspect of the present disclosure includes: a sensor part that includes a diamond having a color center with electron spin; an irradiation part that irradiates the diamond with excitation light; a detection part that detects radiated light from the color center of the diamond; and an optical waveguide that transmits the excitation light and the radiated light.

A diamond sensor system according to another aspect of the present disclosure includes: the diamond sensor unit in which a diamond is disposed on a transmission line that transmits microwaves or millimeter waves, and the sensor part functions as a magnetic sensor; an electromagnetic wave generating part that generates the microwaves, or the millimeter waves; and a control part that controls the irradiation part, the detection part and the electromagnetic wave generating part, wherein the control part irradiates the diamond with the excitation light, and the microwaves or the millimeter waves in a temporally and spatially combined manner.

DETAILED DESCRIPTION

Figures 1, 2:
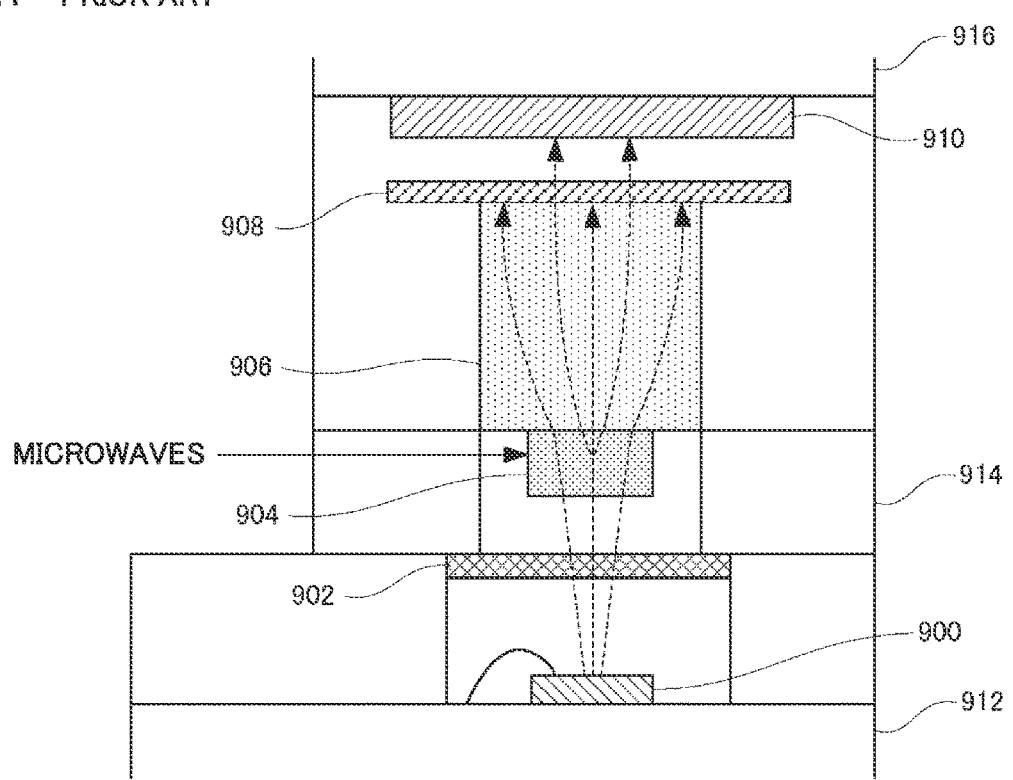
FIG. 1 is a sectional view showing a conventional microscope that uses the NV center of a diamond.
FIG. 2 is a schematic diagram showing a schematic configuration of a diamond sensor unit according to a first embodiment of the present disclosure.

Problem to be Solved by the Present Disclosure

In a case of using a sensor for high-voltage equipment, such as power equipment, a light emitting element and a light receiving element are possibly damaged owing to a high voltage and high current instantaneously caused by electrical discharge and strong electromagnetic waves generated accordingly. The configuration disclosed in Patent Literature 1 cannot be adopted for the sensor used in a high-voltage environment.

Patent Literature 2 discloses that a light emitting element and a light receiving element are disposed to be separated from a diamond and a microwave emission coil. Unfortunately, excitation light and emitted fluorescent light are transmitted as parallel light in the air, and the light is diffused, There is thus a limitation on the distance of separation. In particular, the signal intensity of fluorescent light is low, which causes a problem.

Consequently, the present disclosure has an object to provide a diamond sensor unit and a diamond sensor system that can accurately detect a magnetic field and the like even remotely, without being damaged even in a high-voltage environment.

Advantageous Effect of the Present Disclosure

According to the present disclosure, the diamond sensor unit and the diamond sensor system can be provided that can accurately measure a magnetic field, an electric field and the like even remotely, without being damaged even in a high-voltage environment.

DESCRIPTION OF EMBODIMENTS

The details of embodiments of the present disclosure are listed and described. At least parts of the embodiments described below may be freely combined.

(1) A diamond sensor unit according to a first aspect of the present disclosure includes: a sensor part that includes a diamond having a color center with electron spin; an irradiation part that irradiates the diamond with excitation light; a detection part that detects radiated light from the color center of the diamond; and an optical waveguide that transmits the excitation light and the radiated light. Accordingly, the magnetic field, the electric field and the like can be accurately measured even remotely without damage even in a high-voltage environment.

(2) The sensor part can include a light collecting element that collects the excitation light and the radiated light, and the light collecting element can be disposed between the diamond and the optical waveguide. Accordingly, the losses of the excitation light and the radiated light are reduced, and the detection accuracy can be improved.

(3) The light collecting element may be a spherical lens formed on a silicon oxide basis or a Fresnel lens formed on a silicon oxide basis, and the optical waveguide may be an optical fiber having a core diameter of 1 μm or more and 80 μm or less. Accordingly, the excitation light and the radiated light can be efficiently transmitted, and the detection accuracy can be improved. Furthermore, laser light can be relatively easily introduced to a desired position, and the diffusion at the output end of the optical fiber can be suppressed.

(4) The optical waveguide may be disposed via at least an inside of a piece of insulating glass. Accordingly, even in case electrical discharge or the like occurs in a high-voltage environment where the sensor part is disposed, the detection part and the like can be prevented from being damaged.

(5) The optical waveguide may include one medium that transmits the excitation light and the radiated light, and a fluorescent light reflection filter, an LPF, or a dichroic mirror that separates the excitation light and the radiated light from each other may be included within a predetermined distance from one end positioned more remote from the diamond between both ends of the optical waveguide. Accordingly, in comparison with a case where media for respectively transmitting the excitation light and the radiated light are provided, the number of components can be reduced, which can achieve a simple configuration.

(6) The optical waveguide may include a first optical waveguide that transmits the excitation light, and a second optical waveguide that transmits the radiated light, one end of the first optical waveguide may be disposed closer to the diamond than another end of the first optical waveguide, one end of the second optical waveguide may be disposed closer to the diamond than another end of the second optical waveguide, and a fluorescent light reflection filter, an LPF, or a dichroic mirror that separates the excitation light and the radiated light from each other may be included, within a predetermined distance from each of the one end of the first optical waveguide and the one end of the second optical waveguide. Accordingly, in comparison with a case of transmitting the excitation light and the radiated light together through one medium, the excitation light and the radiated light can be transmitted respectively in suitable forms, which can improve the detection accuracy.

(7) The first optical waveguide may include a first optical fiber, the second optical waveguide may include a second optical fiber, and a core diameter of the second optical fiber may be larger than a core diameter of the first optical fiber. Accordingly, the excitation light and the radiated light can be transmitted in forms suitable for the respective wavelengths, and the detection accuracy can be improved.

(8) The core diameter of the first optical fiber may be 1 μm or more and 100 μm or less, and the core diameter of the second optical fiber may be 1 μm or more and 1 mm or less. Accordingly, the excitation light and the radiated light can be transmitted, using the optical fibers having the core diameters suitable for the respective wavelengths. Thus, optical fibers having unnecessarily large diameters are not used, which can reduce the cost, (9) The diamond may have at least a plurality of flat surfaces, the excitation light may enter a first flat surface among the plurality of flat surfaces, and the detection part may detect the radiated light emitted from a second flat surface that is other than the first flat surface among the plurality of flat surfaces. This negates the need of a member that separates the excitation light and the radiated light from each other (e.g., a fluorescent light reflection filter, an LPF, or a dichroic mirror). Accordingly, the cost can be reduced.

(10) The sensor part that includes the diamond may be entirely formed of an electrical insulating member. Accordingly, even in case electrical discharge or the like occurs in a high-voltage environment where the sensor part is disposed, the sensor part can be hindered from being damaged.

(11) The diamond may be disposed on a transmission line that transmits microwaves or millimeter waves, and the sensor part may function as a magnetic sensor. Accordingly, the NV center of the diamond can be accurately irradiated with microwaves or millimeter waves.

(12) The transmission line may include a main wiring disposed on a rectangular printed board having each side of 5 cm or less, and the diamond may be disposed at one end of the main wiring. Accordingly, the NV center of the diamond can be irradiated with microwaves.

(13) A spin coherence time of the diamond may be less than 50 μsec. Accordingly, the NV center promptly returns from the excited state to the original state. Consequently, the AC magnetic field, electric field and the like can be efficiently detected. In particular, the pulsatingly changing magnetic field, electric field and the like can be detected.

(14) A total hydrogen concentration in the diamond may be 1 ppm or less. Accordingly, the spin coherence time T2 of the diamond can be reduced, and the NV center can promptly return from the excited state to the original state. Consequently, the AC magnetic field, electric field and the like can be efficiently detected,

(15) Each of $NVH^-$ concentration, CH concentration and $CH_2$ concentration in the diamond may be less than 1 ppm. Accordingly, the spin coherence time T2 of the diamond can be reduced, and the NV center can promptly return from the excited state to the original state. Consequently, the pulsatingly changing magnetic field, electric field and the like are included, and the AC magnetic field, electric field and the like can be efficiently detected.

(16) A diamond sensor system according to a second aspect of the present disclosure includes: the diamond sensor unit in which a diamond is disposed on a transmission line that transmits microwaves or millimeter waves, and the sensor part functions as a magnetic sensor; an electromagnetic wave generating part that generates the microwaves, or the millimeter waves; and a control part that controls the irradiation part, the detection part and the electromagnetic wave generating part, wherein the control part irradiates the diamond with the excitation light, and the microwaves or the millimeter waves in a temporally and spatially combined manner. Accordingly, the magnetic field, the electric field and the like can be accurately measured even remotely without damage even in a high-voltage environment.

Details of Embodiments of Present Disclosure

In the following embodiments, the same components are respectively assigned with the same reference numerals. Their names and functions are also the same. Consequently, the detail description about them is not repeated.

First Embodiment

Referring to FIG. 2, a diamond sensor unit 100 according to a first embodiment of the present disclosure includes an excitation light generation part 106, a fluorescent light reflection filter 110, an optical waveguide 112, a sensor part 120, an LPF 122, and a light receiving part 128. An electromagnetic wave generating part 140, and a control part 142 are disposed outside of the diamond sensor unit 100.

Control part 142 includes a CPU (Central Processing Unit), and a storage part (neither is shown). After-mentioned processes performed by control part 142 are achieved by the CPU reading programs preliminarily stored in the storage part, and executing the programs.

Excitation light generation part 106 includes a light emitting element 102, and a light collecting element 104. Under control by control part 142, light emitting element 102 generates excitation light for exciting a diamond $NV^-$ center described later (hereinafter abbreviated as the NV center). For example, control part 142 supplies light emitting element 102 with a voltage for causing light emitting element 102 to emit light at predetermined timing. The excitation light is green light (i.e., with a wavelength of about 490 to 560 nm). Preferably, the excitation light is laser light. Preferably, light emitting element 102 is a semiconductor laser (e.g., the wavelength is 532 nm, which is of the radiated light), Light collecting element 104 collects the excitation light output from light emitting element 102. Light collecting element 104 is for inputting the excitation light output from light emitting element 102 in a diffused manner, as much as possible, into an after-mentioned light incident end of optical waveguide 112. Preferably, light collecting element 104 outputs parallel light collected in a smaller range than the size of the light incident end of optical waveguide 112 (for example, in a case of using an optical fiber, its core diameter (i.e., the diameter of the core)).

Fluorescent light reflection filter 110 is an element for separating the excitation light having entered from light collecting element 104, and light having been radiated from an after-mentioned diamond (i.e., fluorescent light) from each other. For example, fluorescent light reflection filter 110 is a short-pass filter that allows light having a wavelength of a predetermined wavelength or less to travel while cutting light having a wavelength longer than the predetermined wavelength (i.e., reflection), or a bandpass filter that allows light within a predetermined wavelength range to travel while cutting light out of the predetermined wavelength range (i.e., reflection). In general, the excitation light has a shorter wavelength than the fluorescent light does. Accordingly, such a configuration is preferable. Preferably, fluorescent light reflection filter 110 is a dichroic mirror having such a function.

Optical waveguide 112 includes a medium that transmits light, and bi-directionally transmits light. That is, excitation light having entered one end disposed closer to excitation light generation part 106 is transmitted to the other end disposed closer to sensor part 120. Meanwhile, radiated light (i.e., fluorescent light) from a diamond element 116 having entered the other end is transmitted to the one end. Optical waveguide 112 is, for example, an optical fiber. To increase the energy density of the excitation light to be transmitted, it is preferable that the core diameter of the optical fiber be smaller as much as possible. On the other hand, if the core diameter is too small, the efficiency of entrance of light radiated from a light source (i.e., the light emitting element) in a diffused manner into the optical fiber is reduced. Consequently, there is an appropriate core diameter. For example, the core diameter of the optical fiber is about 80 μm or less and 1 μm or more. For example, in a case where the core diameter is larger than 80 μm, it is difficult to increase the energy density of the excitation light even if a lens is used. Accordingly, initialization of the spin of the NV center takes time. Thus, the sensor has a slow response speed. To solve this, a laser having a higher output is required, which makes trade-offs in portability and stability. On the other hand, if the core diameter is smaller than 1 μm, the incident efficiency into the optical fiber is degraded, and light source size of the corresponding laser diode becomes too small. Accordingly, a failure due to catastrophic optical damage (COD) is readily caused. Furthermore, the laser diode having sufficient output as excitation light is limited to an expensive one. Actual use thus becomes difficult.

Figure 3:
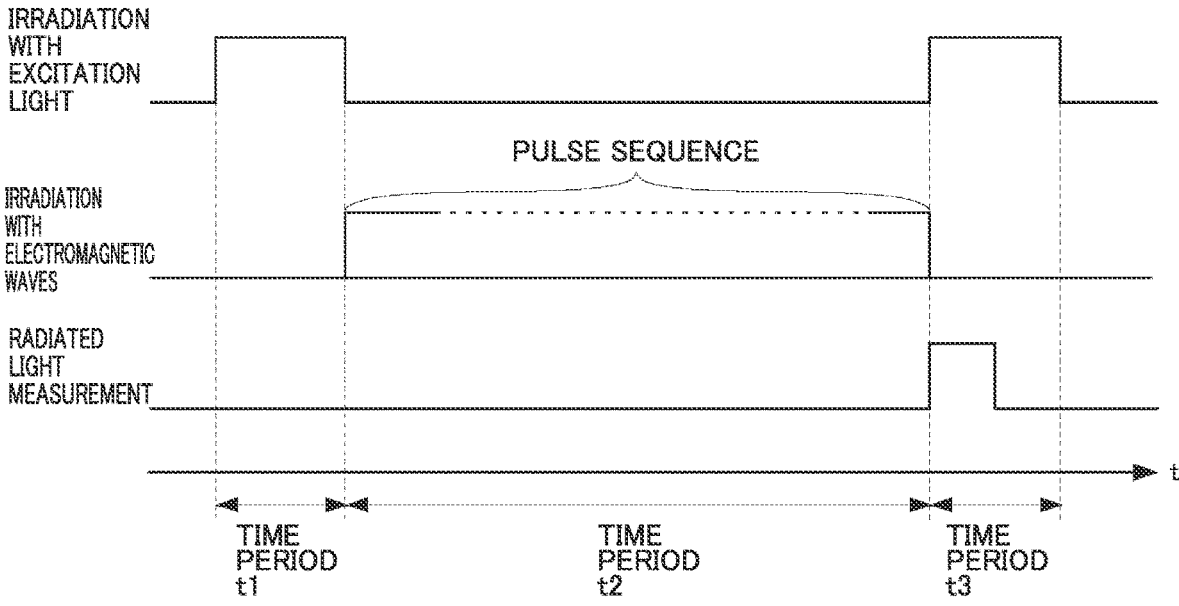
FIG. 3 is a sequence diagram showing the irradiation timing of excitation light and electromagnetic waves during measurement using the diamond sensor unit shown in FIG. 2, and shows the measurement timing of radiated light.

Sensor part 120 includes a light collecting element 114, diamond element 116, and an electromagnetic wave irradiation part 118. Diamond element 116 includes the NV center. Light collecting element 114 is disposed in contact with diamond element 116. Light collecting element 114 converges the excitation light output from optical waveguide 112, and irradiates diamond element 116 with the light. An electromagnetic wave irradiation part 118 irradiates diamond element 116 with electromagnetic waves (e.g., microwaves). Electromagnetic wave irradiation part 118 is, for example, a coil formed to include an electrical conductor. The electromagnetic waves are supplied from electromagnetic wave generating part 140 outside of diamond sensor unit 100 to electromagnetic wave irradiation part 118. The irradiation of diamond element 116 with the excitation light and the electromagnetic waves is controlled by control part 142, and is performed at timing as shown in FIG. 3, for example. That is, control part 142 controls light emitting element 102 so as to output excitation light at predetermined timing for a predetermined time (e.g., a time period t1). Control part 142 controls electromagnetic wave generating part 140 so as to output electromagnetic waves at predetermined timing for a predetermined time (e.g., a time period t2). A pulse sequence in time period t2 may be an appropriate one in accordance with the diamond to be used (for example, the degree of bearing alignment of a plurality of NV centers), an observed signal (i.e., a signal affected by the spin state at the NV center) and the like. Accordingly, the electromagnetic waves are temporally and spatially combined with the excitation light, and diamond element 116 is irradiated with them. As described later, control part 142 captures, at predetermined timing (e.g., in a time period t3), an output signal of a light detection part 126 that is to be input, and stores the signal in the storage part.

Figure 4:
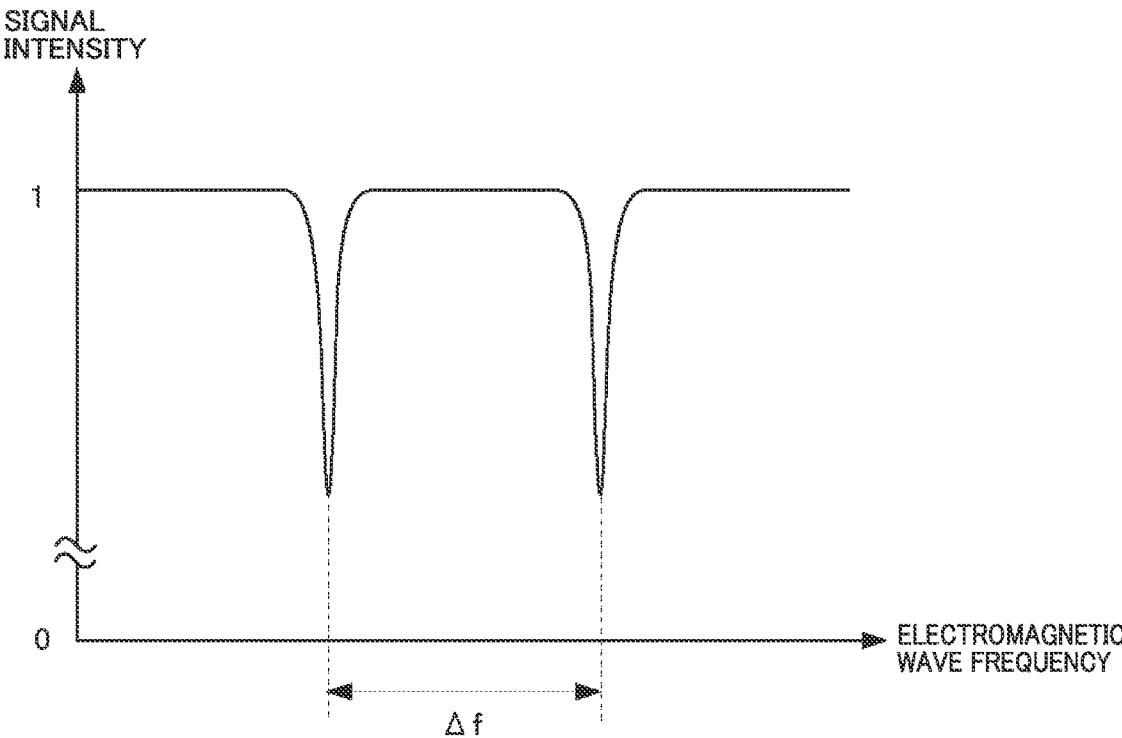
FIG. 4 is a graph schematically showing the relationship between the observed signal intensity (i.e., radiated light intensity), and the frequency of electromagnetic waves (i.e., microwaves).

The NV center has a structure where a carbon (C) atom in a diamond crystal is replaced with a nitrogen (N) atom, a carbon atom that should be adjacently present is 1.0 absent (i.e., a hole (V)), The NV center transitions from the ground state to the excited state by green light having a wavelength of about 490 to 560 nm (e.g., laser light of 532 nm), and emits red light having a wavelength of about 630 to 800 nm (e.g., fluorescent light of 637 nm) and returns to the ground state. In a state where one electron is captured (i.e., NV⁻), the NV center forms a spin-triplet state with magnetic quantum numbers m s of −1, 0, and +1, and possible presence of a magnetic field separates the energy level in a state of $m_s=\pm 1$ in accordance with the magnetic field intensity (i.e., Zeeman splitting). The NV center is irradiated with microwaves of about 2.87 GHz, a state of $m_s=0$ is caused to transition to a state of $m_s=\pm 1$. (i.e., electron spin resonance), subsequently irradiated with green light, and excitation is caused. Thus, the transition returning to the ground state includes transition without radiation of light (i.e., fluorescent light). Accordingly, the intensity of radiated light to be observed decreases. Consequently, in the ESR (Electron Spin Resonance) spectrum, a valley (i.e., falling of the signal) is observed. By control part 142 controlling light emitting element 102 and electromagnetic wave generating part 140 as described above, a spectrum as shown in FIG. 4 is measured, for example. The observed Δf depends on the magnetic field intensity at the position of diamond element 116.

As for specific measurement of the spectrum, the measurement is performed as follows. That is, light radiated form diamond element 116 in a diffused manner (i.e., fluorescent light) is collected by light collecting element 114, and enters, as parallel light, the other end of optical waveguide 112. The light input into optical waveguide 112 (i.e., fluorescent light) is transmitted through optical waveguide 112, and is output from the one end of optical waveguide 112. The light output from the one end of optical waveguide 112 (i.e., fluorescent light) is reflected by fluorescent light reflection filter 110, passes through LPF 122, is collected by a light collecting element 124, and is emitted to light detection part 126. Accordingly, the light having a frequency in accordance with the magnetic field at the position where diamond element 116 is disposed is detected by light detection part 126. Light detection part 126 generates an electric signal in accordance with the incident light, and outputs the signal. Light detection part 126 is, for example, a photodiode. The output signal of light detection part 126 is obtained by control part 142.

LPF 122 is a long-pass filter, allows light having a wavelength that is a predetermined wavelength or more to pass while cutting light having wavelengths shorter than the predetermined wavelength (e.g., reflection). The radiated light from diamond element 116 is red light, which passes through LPF 122. However, since the excitation light has a shorter wavelength than the red light, the excitation light does not pass through LIT 122. Thus, the excitation light radiated from light emitting element 102 is prevented from being detected by light detection part 126, from serving as noise, and from reducing the detection sensitivity of the radiated light (i.e., fluorescent light) from diamond element 116.

As described above, control part 142 irradiates diamond element 116 with excitation light, and sweeps the frequency of electromagnetic waves in a predetermined range and irradiates diamond element 116 with the light, thus allowing the light (e.g., fluorescent light) radiated from diamond element 116 to be obtained as the electric signal output from light detection part 126. Based on observed Δf (i.e., the value depending on the magnetic field intensity at the position of diamond element 116), the magnetic field intensity at the position of diamond element 116 can be calculated. That is, diamond sensor unit 100 functions as a magnetic sensor. Note that diamond sensor unit 100 can be used as a sensor for detecting not only the magnetic field (i.e., magnetic field) but also physical quantities related to the magnetic field, e.g., the magnetization, electric field, voltage, current, temperature, pressure, etc.

In a case where an optical fiber is adopted as optical waveguide 112, diamond element 116, which is the main part of the sensor, and light collecting element 114 are formed of an electrical insulator, and occurrence of damage due to electrical discharge or the like can be suppressed accordingly, even with sensor part 120 and the other end of optical waveguide 112 being installed in a high-voltage facility or the like. Consequently, the magnetic field and the like can be safely measured in a high-voltage environment by diamond sensor unit 100, Furthermore, excitation light generation part 106 and light receiving part 128 can be disposed remotely from the high-voltage environment, via, optical waveguide 112. The magnetic field and the like can be remotely measured by diamond sensor unit 100. Sensor part 120 includes light collecting element 114 disposed between diamond element 116 and optical waveguide 112. Accordingly, the losses of the excitation light and the radiated light can be reduced, and the detection accuracy can be improved. Fluorescent light reflection filter 110, which separates the excitation light and the radiated light from each other, is provided, and transmission of the excitation light and the radiated light can be performed through a single medium (e.g., optical waveguide 112). Accordingly, as described later, in comparison with a case where two media for respectively transmitting the excitation light and the radiated light are provided, the number of components can be reduced, which can achieve a simple configuration.

Second Embodiment

Figure 5:
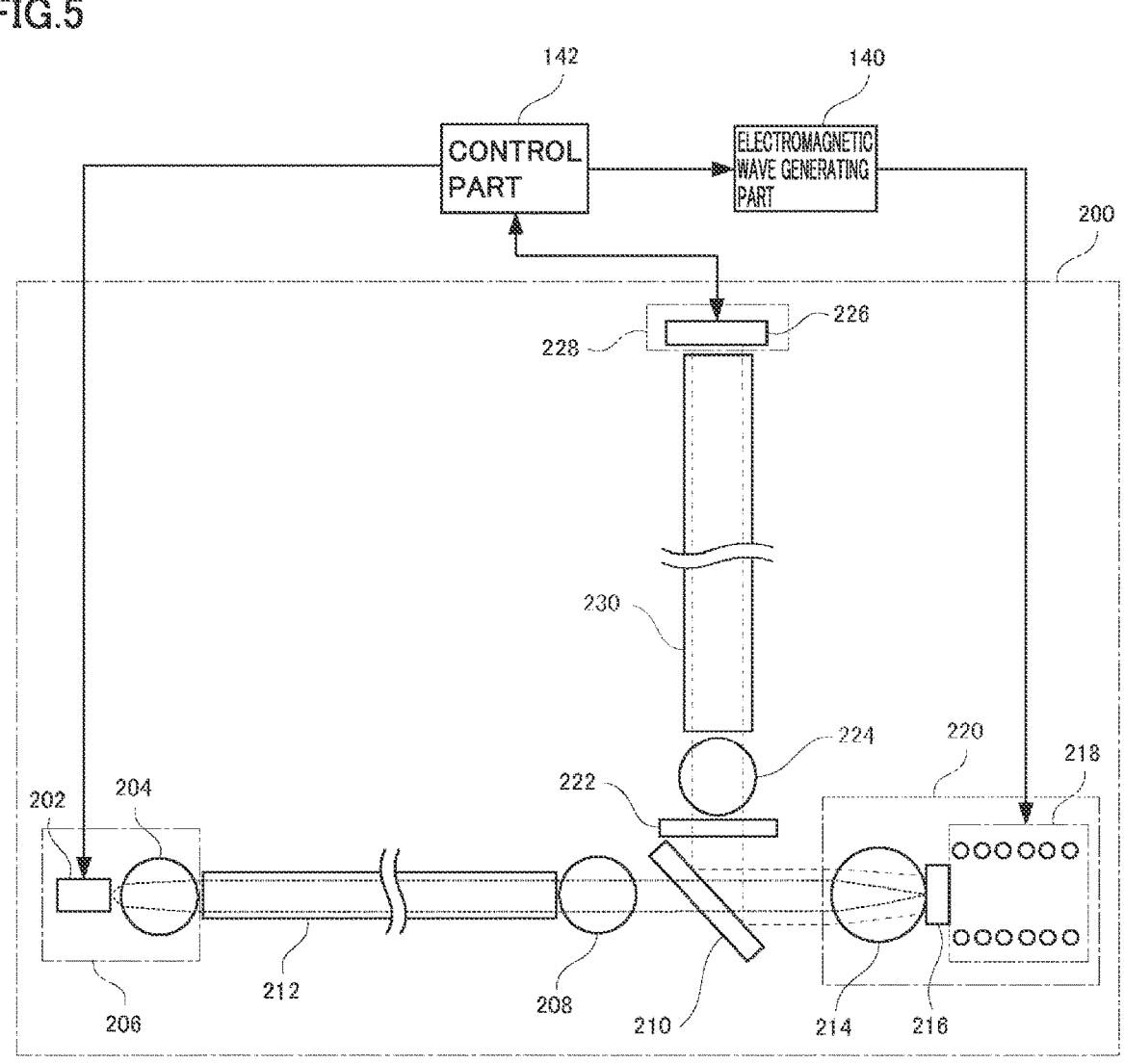
FIG. 5 is a schematic diagram showing a schematic configuration of a diamond sensor unit according to a second embodiment of the present disclosure.

In the first embodiment, the light (i.e., the excitation light and the radiated light) is bi-directionally transmitted using single optical waveguide 112. In a second embodiment, optical waveguides for respectively transmitting the excitation light for and the radiated light from a diamond element 216 are used. Referring to FIG. 5, a diamond sensor unit 200 according to the second embodiment of the present disclosure includes an excitation light generation part 206, a first optical waveguide 212, a light collecting element 208, a fluorescent light reflection filter 210, a sensor part 220, an LPF 22.2, a light collecting element 224, a second optical waveguide 230, and a light receiving part 228. Similar to the first embodiment, an electromagnetic wave generating part 140, and a control part 142 are disposed outside of the diamond sensor unit 200.

Excitation light generation part 206 includes a light emitting element 202, and a light collecting element 204. Sensor part 220 includes a light collecting element 214, diamond element 216, and an electromagnetic wave irradiation part 218. Light receiving part 228 includes a light detection part 226. Light emitting element 202, light collecting element 204, fluorescent light re lection filter 210, light collecting element 214, diamond element 216, electromagnetic wave irradiation part 218, LPF 222, and light detection part 226 respectively correspond to light emitting element 102, light collecting element 104, fluorescent light reflection filter 110, light collecting element 114, diamond element 116, electromagnetic wave irradiation part 118, LPF 122, and light detection part 126 shown in FIG. 2, and similarly function. Consequently, these are briefly described.

Similar to the first embodiment, under control by control part 142, light emitting element 202 generates excitation light for exciting the diamond NV center. For example, control part 142 supplies, at predetermined timing, light emitting element 202 with a voltage for causing light emitting element 202 to emit light. The excitation light is green light. Preferably, the excitation light is laser light. Preferably, light emitting element 202 is a semiconductor laser. Light collecting element 204 collects the excitation light output from light emitting element 202 in a diffused manner, and inputs the light into a light incident end of first optical waveguide 212.

First optical waveguide 212 includes a medium for transmitting light. Unlike optical waveguide 112 shown in FIG. 2, first optical waveguide 212 transmits the excitation light but does not transmit the radiated light from diamond element 216. That is, the excitation light incident on one end (i.e., an incident end) of first optical waveguide 212 disposed closer to excitation light generation part 206 is transmitted to the other end (i.e., an output end) disposed closer to sensor part 220, and is output. First optical waveguide 212 is, for example, an optical fiber. The excitation light output from first optical waveguide 212 in a diffused manner is collected by light collecting element 208, and enters, as parallel light, fluorescent light reflection filter 210.

Fluorescent light reflection filter 210 is an element for separating the excitation light having entered from light collecting element 208, and light having been radiated from diamond element 216 (i.e., fluorescent light) from each other. Fluorescent light reflection filter 210 may be a dichroic mirror.

Light collecting element 214 converges the excitation light having passed through fluorescent light reflection filter 210 and entered, and irradiates diamond element 216 with the light. Light collecting element 214 is disposed in contact with diamond element 216. Diamond element 216 includes an NV center. Electromagnetic wave irradiation part 218 irradiates diamond element 216 with electromagnetic waves (e.g., microwaves). Electromagnetic wave irradiation part 218 is, for example, a coil. Electromagnetic waves are supplied from electromagnetic wave generating part 140 to electromagnetic wave irradiation part 218. The irradiation of diamond element 216 with the excitation light and the electromagnetic waves is controlled by control part 142, and is controlled at timing as shown in FIG. 3, for example. Accordingly, as described above, red light (i.e., fluorescent light) is radiated from diamond element 216.

The light radiated from diamond element 216 in a diffused manner (i.e., red fluorescent light) is collected by light collecting element 214 as parallel light, and is incident on fluorescent light reflection filter 210. The light (i.e., red fluorescent light) incident on fluorescent light reflection filter 210 is reflected by fluorescent light reflection filter 210, and enters LPF 222. The radiated light (i.e., red fluorescent light) from diamond element 216 that is incident on LPF 222 passes through LPF 222, is collected by light collecting element 224, and enters one end (i.e., an incident end) of second optical waveguide 230. LPF 222 prevents the excitation light radiated from light emitting element 202 from being detected by light detection part 226, from serving as noise, and from reducing the detection sensitivity of the radiated light (i.e., fluorescent light) from diamond element 216.

Second optical waveguide 230 includes a medium for transmitting light. Second optical waveguide 230 transmits the light (i.e., the radiated light from diamond element 216) entering one end (i.e., an incident end) from light collecting element 224, to the other end (i.e., an output end) disposed closer to light receiving part 228. Light output from second optical waveguide 230 is detected by light detection part 226. Light detection part 226 is, for example, a photodiode. The output signal of light detection part 226 is obtained by control part 142.

As described above, similar to the first embodiment, control part 142 irradiates diamond element 216 with excitation light, and sweeps the frequency of electromagnetic waves in a predetermined range and irradiates diamond element 216 with the light, thus allowing the light (e.g., fluorescent light) radiated from diamond element 216 to be obtained as the electric signal output from light detection part 226. Consequently, diamond sensor unit 200 functions as a magnetic sensor. Diamond sensor unit 200 can be used as a sensor for detecting not only the magnetic field but also physical quantities related to the magnetic field, e.g., the magnetization, electric field, voltage, current, temperature, pressure, etc.

In a case where the optical fibers are adopted as the two optical waveguides, diamond element 216, which is the main part of the sensor, and light collecting element 214 are formed of an electrical insulator, and occurrence of damage due to electrical discharge or the like can be suppressed accordingly. Consequently, the magnetic field and the like can be safely measured in a high-voltage environment by diamond sensor unit 200. Furthermore, excitation light generation part 206 and light receiving part 228 can be disposed remoted from high-voltage environment via first optical waveguide 212 and second optical waveguide 230. The magnetic field and the like can be remotely measured by diamond sensor unit 200. Sensor part 220 includes light collecting element 214 disposed between diamond element 216, and first optical waveguide 212 and second optical waveguide 230. Accordingly, the losses of the excitation light and the radiated light can be reduced, and the detection accuracy can be improved.

Through use of the two optical waveguides first optical waveguide 212 and second optical waveguide 230), the excitation light and the radiated light from diamond element 216 that have wavelengths different from each other can be appropriately transmitted. That is, through use of the optical fibers having core diameters in accordance with the wavelengths, the respectively suitable light collecting optical systems (i.e., light collecting element 204, light collecting element 208, light collecting element 214, and light collecting element 224) can be designed, the light transmission efficiency can be improved, and the measurement accuracy can be improved. In the case of using the optical fibers as the optical waveguides, it is preferable that the core diameter of the optical fiber (i.e., second optical waveguide 230) for transmitting the radiated light from the diamond be larger than the core diameter of the optical fiber first optical waveguide 212) for transmitting the excitation light.

As described above, to increase the energy density of the excitation light, it is preferable that the core diameter of the optical fiber used for transmitting the excitation light preferably be small. However, if the core diameter is too small, a loss occurs when light enters the optical fiber from the light source. Consequently, there is an appropriate degree of the core diameter. Preferably, the core diameter of first optical waveguide 212 is 1 μm or more and 100 μm or less. On the other hand, preferably, the core diameter of the optical fiber for transmitting the radiated light from diamond element 216 is large as much as possible. Note that if the core diameter is too large, the cost increases, Preferably, the core diameter of second optical waveguide 230 is 1 μm or more and 1 mm or less. Note that also in this case, if the core diameter of second optical waveguide 230 is smaller than the core diameter of first optical waveguide 212, the fluorescent light caused by the excitation light is not sufficiently collected, and the loss of drive power increases. Consequently, the core diameter of second optical waveguide 230 is preferably equal to or larger than the core diameter of first optical waveguide 212, and more preferably larger than the core diameter of first optical waveguide 212. For example, if the core diameter of first optical waveguide 212 is 1 μm, the core diameter of second optical waveguide 230 is preferably 1 μm or more, is more preferably 2.5 μm or more, and is further preferably 50 μm or more. If the core diameter of first optical waveguide 212 is 1 μm, the core diameter of second optical waveguide 230 that is 80 μm is more preferable than that of 50 μm; 400 μm or more is more preferable, and 800 μm or more is further preferable. For example, if the core diameter of first optical waveguide 212 is 80 μm, the core diameter of second optical waveguide 230 is preferably 80 μm) or more, is more preferably 105 μm or more, is further preferably 400 μm or more, and is still further preferably 800 μm or more. In every case, if the core diameter is larger than 1 mm, inconveniences, such as resistance to bending the optical fiber, and the accompanying cost, occur. As described above, if the core diameter of first optical waveguide 212 is in a range from 1 μm or more and 100 μm or less, the preferable condition described above holds.

First Modification

In the second embodiment, the excitation light and the radiated light from diamond element 216 are separated from each other using fluorescent light reflection filter 210 and LPF 222. However, there is no limitation to this. The excitation light and the radiated light from diamond element 216 may be separated from each other using the excitation light reflection filter having the function of LPF.

Figure 6:
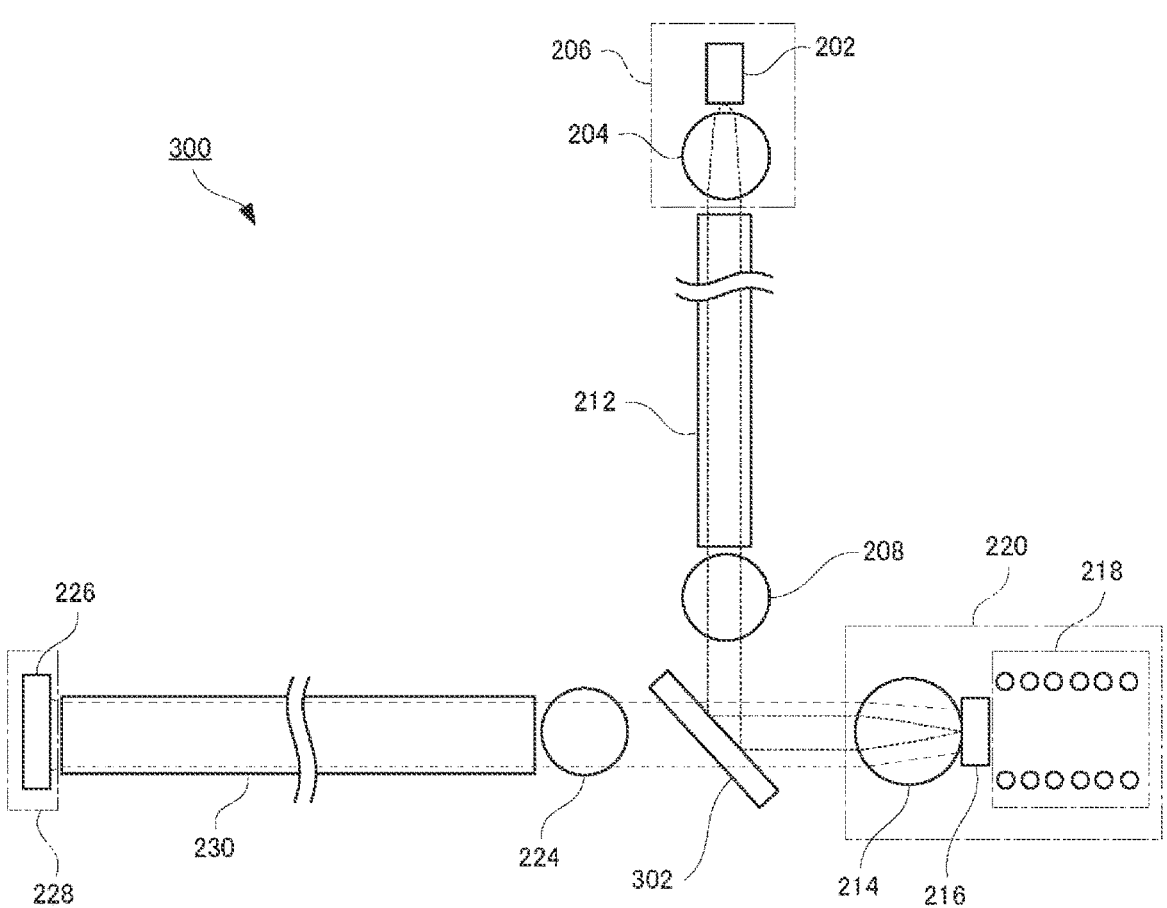
FIG. 6 is a schematic diagram showing a schematic configuration of a diamond sensor unit according to a first modification.

Referring to FIG. 6, a diamond sensor unit 300 according to a first modification separates the excitation light from light emitting element 202, and the radiated light from diamond element 216 from each other, using an excitation light reflection filter 302 having the function of LPF. Diamond sensor unit 300 is diamond sensor unit 200 (see FIG. 5) where fluorescent light reflection filter 210 and LPF 222 are replaced with an excitation light reflection filter 302 having the function of LIT, and the path of occurrence and transmission of excitation light, and the path of transmission and detection of radiated light from diamond element 216 are replaced with each other. Excitation light reflection filter 302 having the function of LIT is a long-pass filter, and is also an excitation light reflection filter. In FIG. 6, configuration elements assigned with the same symbols as in FIG. 5 represent the same elements in FIG. 5. Consequently, redundant description about them is not repeated.

The excitation light caused by light emitting element 202 is collected by light collecting element 204, and enters one end of first optical waveguide 212. The excitation light is transmitted through first optical waveguide 212, is output from the other end of first optical waveguide 212, is collected by light collecting element 224 as parallel light, which enters excitation light reflection filter 302 having the function of LPF. Since the excitation light is green light, the light is reflected by excitation light reflection filter 302 having the function of and enters light collecting element 214.

On the other hand, the radiated light from diamond element 216 is collected by light collecting element 214 as parallel light, which enters excitation light reflection filter 302 having the function of LPF. The radiated light (i.e., red fluorescent light) from diamond element 216 passes through excitation light reflection filter 302 having the function of LIEF, is collected by light collecting element 224, enters second optical waveguide 230, is transmitted through second optical waveguide 230 to light receiving part 228, and is detected by light receiving part 228. Consequently, similar to diamond sensor unit 200 in the second embodiment, diamond sensor unit 300 functions as a sensor that detects the magnetic field and the like.

Second Modification

The case where the excitation light is incident on one surface of the diamond element including the NV center, and the radiated light from the same surface is measured has been described above. However, there is no limitation to this. In a case where the diamond element including the NV center has a plurality of flat surfaces, a surface irradiated with the excitation light, and a surface where the radiated light is measured may be different from each other. The flat surface means one flat surface having a predetermined area or more. Here, the flat surface of the diamond element including the NV center means one flat surface having an area larger than a circle having a diameter of about 200 μm.

Figure 7:
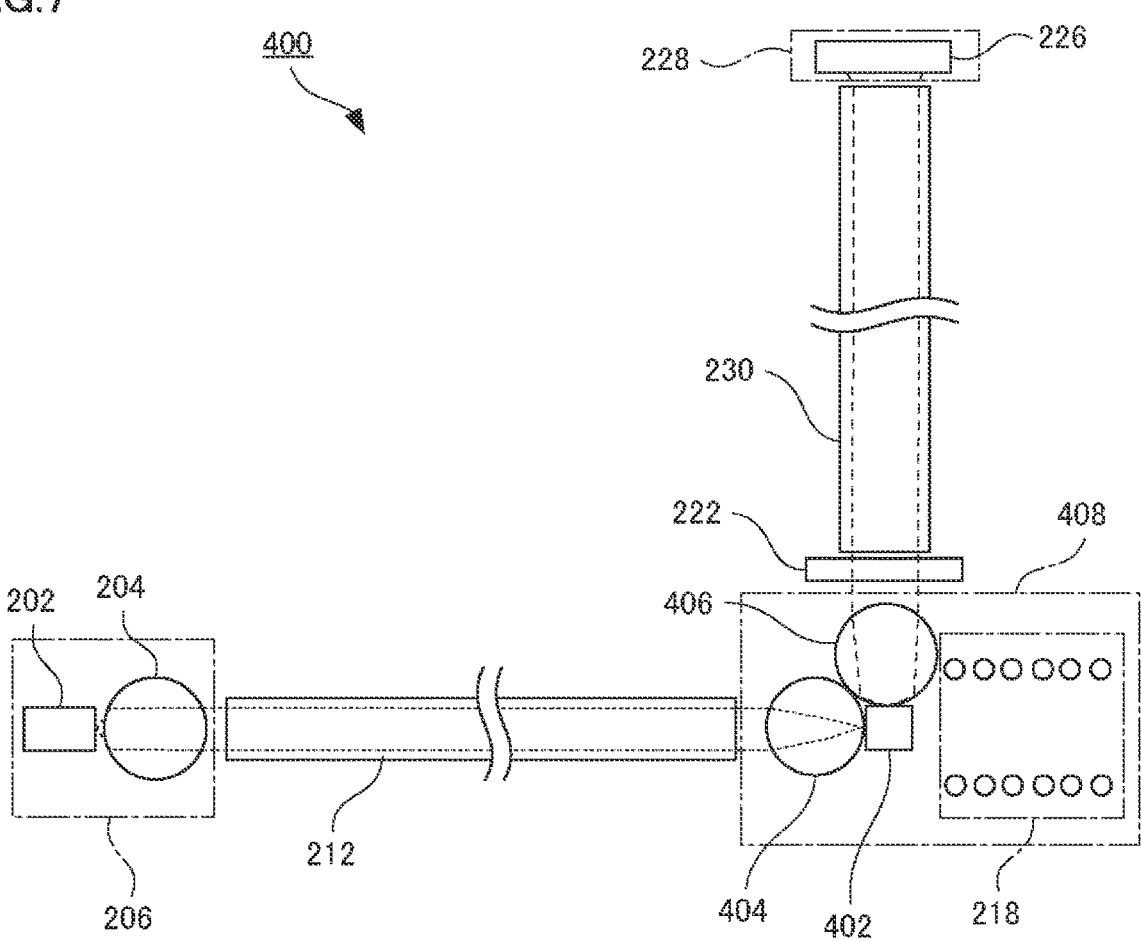
FIG. 7 is a schematic diagram showing a schematic configuration of a diamond sensor unit according to a second modification.

Referring to FIG. 7, diamond sensor unit 400 according to a second modification detects light radiated from a surface different from a surface through which the excitation light has entered a diamond element 402. Diamond sensor unit 400 is diamond sensor unit 200 shown in FIG. 5 in which sensor part 220 is replaced with sensor part 408 and from which light collecting element 208, fluorescent light reflection filter 210, and light collecting element 224 are removed. In FIG. 7, configuration elements assigned with the same symbols as in FIG. 5 represent the same elements in FIG. 5. Redundant description about them is not repeated.

Sensor part 408 includes diamond element 402, a light collecting element 404, a light collecting element 406, and electromagnetic wave irradiation part 218. Diamond element 402 includes the NV center, and has a plurality of flat surfaces. Diamond element 402 is formed to be a rectangular parallelepiped, for example. Light collecting element 404 is disposed in contact with one flat surface (hereinafter called a first flat surface) of diamond element 402. Light collecting element 406 is disposed in contact with a flat surface (hereinafter called a second flat surface) of diamond element 402 that is different from the first flat surface.

The excitation light transmitted from first optical waveguide 212 enters light collecting element 404, is collected by light collecting element 404, and is irradiated to the first flat surface of diamond element 402. As described above, diamond element 402 is irradiated with the excitation light and irradiated with electromagnetic waves (e.g., microwaves) from electromagnetic wave irradiation part 218 at predetermined timing, thus allowing diamond element 402 to radiate light. The radiated light is radiated in all the directions. Light (i.e., red fluorescent light) emitted from the second flat surface of diamond element 402 is collected by light collecting element 406 as parallel light, enters Lin 222, passes through LIT 222, and enters one end of second optical waveguide 230. Subsequently, the light (i.e., red fluorescent light) radiated from the second flat surface of diamond element 402 is transmitted through second optical waveguide 230 to light detection part 226, and is detected by light detection part 226. Consequently, similar to diamond sensor unit 200 in the second embodiment, diamond sensor unit 400 functions as a sensor that detects the magnetic field and the like.

As described above, by adopting the configuration where the radiated light is detected from the surface (i.e., the second flat surface) different from the surface (i.e., the first flat surface) irradiated with the excitation light, the number of light collecting elements can be reduced, and the elements (e.g., the fluorescent light reflection filter etc.) for separating the excitation light from the radiated light from the diamond element can be omitted. Consequently, the diamond sensor unit can have a simpler configuration, and the cost can be reduced.

The case where diamond element 402 is formed to be a rectangular parallelepiped, and the first flat surface and the second flat surface are two surfaces forming an angle of 90 degrees has been described above. However, there is no limitation to this. In the case where diamond element 402 is formed to have a rectangular parallelepiped, a flat surface parallel with the first flat surface may be the second flat surface for collecting the radiated light that is a detection target. Diamond element 402 is only required to have at least two flat surfaces. There is no limitation to the hexahedron. Any shape may be adopted as that of diamond element 402.

Third Modification

The case where the diamond element including the NV center is irradiated with electromagnetic waves (e.g., microwaves) has been described above. However, there is no limitation to this. As disclosed in NPL 1, the diamond element including the NV center functions as a magnetic sensor even without irradiation with electromagnetic waves.

Figure 8:
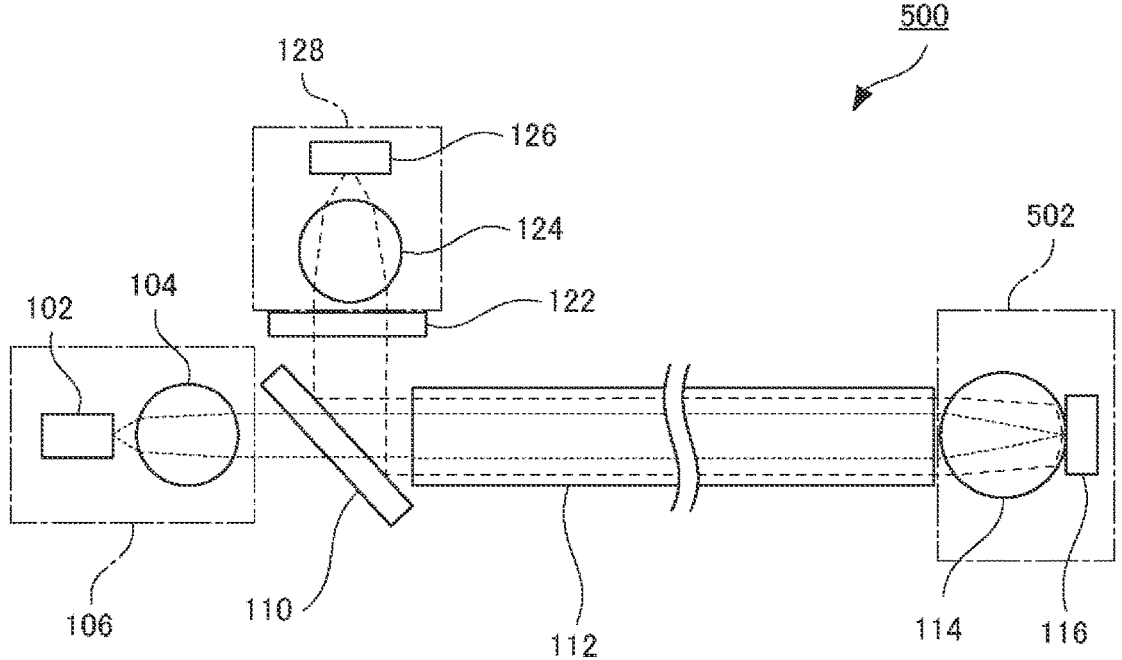
FIG. 8 is a schematic diagram showing a schematic configuration of a diamond sensor unit according to a third modification.

Referring to FIG. 8, a diamond sensor unit 500 according to a third modification is diamond sensor unit 100 shown in FIG. 2 where electromagnetic wave irradiation part 118 is removed. That is, a sensor part 502 includes light collecting element 114, and diamond element 116, but does not include the electromagnetic wave irradiation part (e.g., a coil or the like). Similar to diamond sensor unit 100 (see FIG. 2), diamond sensor unit 500 allows diamond element 116 to be irradiated with the excitation light (i.e., green light) output from light emitting element 102. Accordingly, the NV center of diamond element 116 is excited, radiates light (i.e., red fluorescent light), and returns to the original state. Consequently, by measuring the radiated light, diamond sensor unit 500 functions as a magnetic sensor.

The measurement principle using microwaves is as described above. Through use of the difference between the intensity of the fluorescent light from the ground level and the intensity of the fluorescent light from the excited level achieved by microwave resonance absorption, the resonant level can be quantified by the frequency of microwaves, and the change in magnetic field can be measured based on the change in resonant level. On the other hand, the measurement principle used here uses the change in fluorescent light intensity even in a case of emitting no microwave. That is, the change of the electron at the ground level due to the effect of the magnetic field, and the change of the fluorescent light intensity in a manner correlated with the magnetic field are used.

Consequently, diamond sensor unit 500 functions as a sensor that detects the magnetic field etc. Sensor part 502 does not include a conductive member, such as a coil, and is entirely made of an electrical insulating member. Consequently, sensor part 502 is not damaged due to electrical discharge or the like even in a case of being installed in a high-voltage facility. As a result, the magnetic field and the like can be safely measured in a high-voltage environment by diamond sensor unit 500.

Fourth Modification

Figure 9:
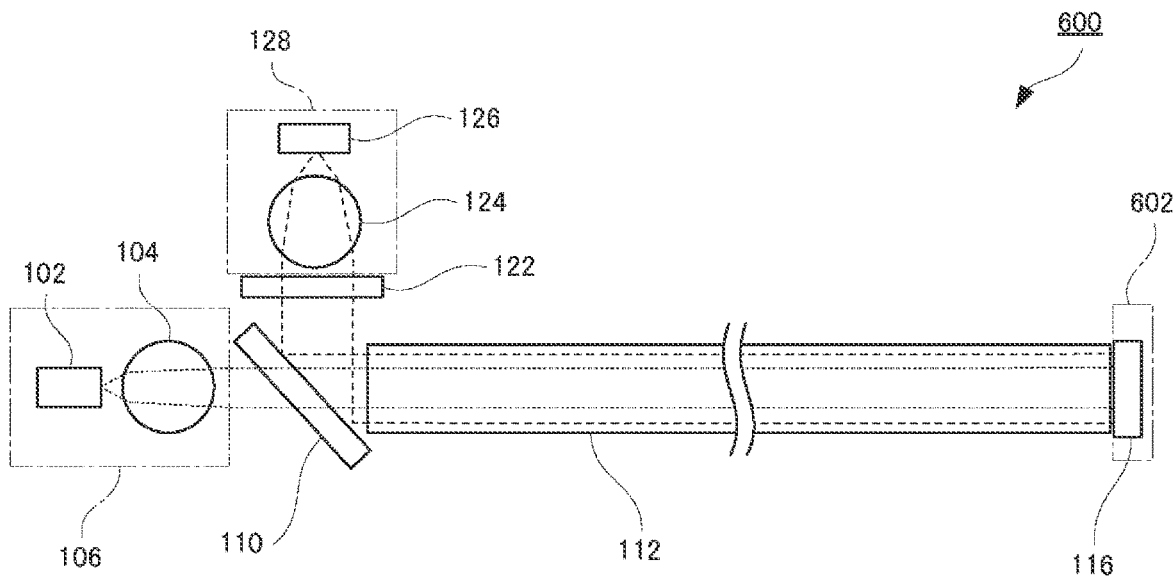
FIG. 9 is a schematic diagram showing a schematic configuration of a diamond sensor unit according to a fourth modification.

The configuration that causes the diamond element including the NV center to function as a magnetic sensor without irradiation with electromagnetic waves is not limited to that shown in FIG. 8. Referring to FIG. 9, a diamond sensor unit 600 according to a fourth modification is diamond sensor unit 100 shown in FIG. 2 from which light collecting element 114 and electromagnetic wave irradiation part 118 are removed. That is, a sensor part 602 includes diamond element 116, but includes neither the light collecting element nor the electromagnetic wave irradiation part. Diamond element 116 is disposed in contact with an end of optical waveguide 112.

Similar to diamond sensor unit 100 (see FIG. 2), when diamond sensor unit 600 irradiates diamond element 116 with the excitation light (i.e., green light) output from light emitting element 102, the NV center of diamond element 116 is excited and radiates light (i.e., red fluorescent light), and the state is returned to the original state. Consequently, by measuring the radiated light, diamond sensor unit 600 functions as a magnetic sensor. The method of measuring the magnetic field is similar to that in the third modification.

Consequently, diamond sensor unit 600 functions as a sensor that detects the magnetic field etc. Sensor part 602 does not include a conductive member, such as a coil, and is entirely made of an electrical insulating member. Consequently, sensor part 602 is not damaged by electrical discharge or the like even in a case of being installed in a high-voltage facility, and can safely measure the magnetic field and the like in the high-voltage environment.

Fifth Modification

Figure 10:
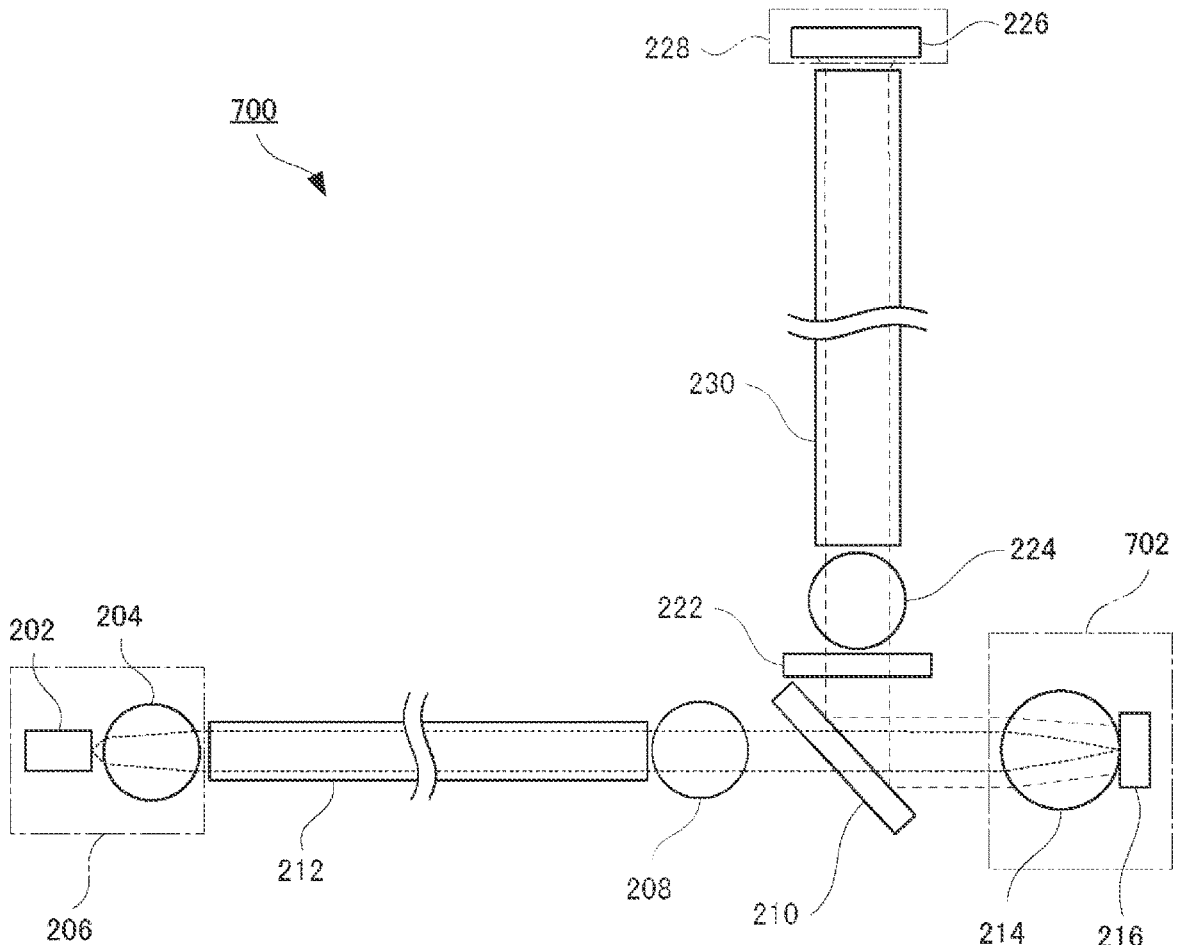
FIG. 10 is a schematic diagram showing a schematic configuration of a diamond sensor unit according to a fifth modification.

In the third modification and the fourth modification, the excitation light and the radiated light are transmitted through the single optical waveguide. Two optical waveguides may be used to transmit the excitation light and the radiated light, respectively. Referring to FIG. 10, a diamond sensor unit 700 according to a fifth modification is diamond sensor unit 200 shown in FIG. 5 where electromagnetic wave irradiation part 218 is removed. That is, a sensor part 702 includes light collecting element 214, and diamond element 216, but does not include the electromagnetic wave irradiation part (e.g., a coil or the like). Similar to diamond sensor unit 200 (see FIG. 5), when diamond sensor unit 700 irradiates diamond element 216 with the excitation light (i.e., green light) output from light emitting element 202, the NV center of diamond element 216 is excited and radiates light (i.e., red fluorescent light), and the state is returned to the original state, Consequently, by measuring the radiated light, diamond sensor unit 700 functions as a magnetic sensor. The method of measuring the magnetic field measurement is similar to that in the third modification.

Consequently, diamond sensor unit 700 functions as a sensor that detects the magnetic field etc. Sensor part 702 does not include a conductive member, such as a coil, and is entirely made of an electrical insulating member. Consequently, sensor part 702 is not damaged by electrical discharge or the like even in a case of being installed in a high-voltage facility, and can safely measure the magnetic field and the like in the high-voltage environment.

Note that in each of diamond sensor unit 300 shown in FIG. 6, and diamond sensor unit 400 shown in FIG. 7, electromagnetic wave irradiation part 218 may be removed. Also in this case, the magnetic field can be measured without irradiation with electromagnetic waves.

The case where the diamond element including the NV center is used as the diamond sensor unit has been described above. However, there is no limitation to this. The diamond element is only required to have a color center with electron spin. The color center with electron spin is a center that forms a spin-triplet state, and emits light by excitation. The NV center is a typical example. Furthermore, it has been known that a color center with electron spin is present also at a silicon-hole center (i.e., Si—V center), germanium-hole center (i.e., Ge—V center), and tin-hole center (i.e., Sn—V center). Consequently, a diamond sensor unit may be configured using a diamond element including any of them instead of the diamond element including the NV center.

Note that depending on the level of the color center, the wavelengths of the excitation light and the radiated light (i.e., fluorescent light), and the frequency of electromagnetic waves causing resonance excitation vary. Among them, the NV center is preferable in terms of the wavelength of light and the frequency of microwaves. In the cases of the Si—V center, Ge—V center, and Sn—V center, millimeter waves (e.g., 30 GHz to 300 GHz) or submillimeter waves (e.g., 300 GHz to 3 GHz) that have frequencies higher than the frequency of microwaves (e.g., 1 GHz to GHz) are used as electromagnetic waves with which irradiation is performed. For example, in the case of Si—V center, millimeter waves at about 48 GHz can be used. In the case of Sn—V center, submillimeter waves at about 850 GHz can be used.

Preferably, the excitation light is laser light. It is preferable that the generation device be a semiconductor laser in terms of reduction in size. A detector for the radiated light from the diamond element may be of a vacuum tube type. However, a semiconductor detection device is preferable in terms of reduction in size.

Preferably, the optical waveguide has a two-or-more-layered coaxial structure that includes a core portion through which light passes, and a portion that is made of a material having an refractive index different from that of the core portion and is formed around the core. The core portion is not necessarily made in a form densely filled with a medium for transmitting light. Since the space itself can transmit light, the core may be hollow. Preferably, the optical waveguide is an optical fiber having a core diameter of 1 μm or more and 80 μm or less. This is because through use of the optical fiber, laser light can be relatively easily introduced to a desired position, and the diffusion at the output end of the optical fiber can be suppressed.

The light collecting element is only required to be formed of a material having a function of collecting light. For example, the element may be a lens formed of a silicon-oxide-based material (e.g., glass; an additive other than silicon oxide may be contained), or a material having a diffractive function. Preferably, the light collecting element is a lens that allows light to pass and uses a refractive phenomenon. A spherical lens, a hemispherical lens, and a Fresnel lens are preferable. In particular, in terms of the relationship between the refractive index and the spherical shape, a lens having a focal point of parallel light on a spherical surface is more preferable. This is because through use of such a lens, adjustment of the optical focal point and the optical axis becomes significantly simple, and the amount of light can be utilized as much as possible. Preferably, the lens made of a silicon-oxide-based material is in direct contact with the diamond. This is because without contact, a failure of incapability of appropriately collecting light occurs. Furthermore, this is because with a strong impact, the distance from the diamond to the lens is sometimes changed, and light cannot appropriately be collected in such a case. More preferably, the lens made of a silicon-oxide-based material is in direct contact also with the optical fiber. This is because the loss during collection of fluorescent light into the optical fiber decreases, and is unlikely to cause a change in distance due to an impact.

Preferably, in a case where the sensor part is disposed in a high-voltage environment, the optical waveguide (e.g., the optical fiber) for transmitting the excitation light and the radiated light from the diamond is disposed through insulating glass. Accordingly, the excitation light generation part and the light receiving part can be insulated from a high voltage, the devices used in the excitation light generation part and the light receiving part can be protected.

The electromagnetic wave irradiation part is not limited to a coil-shaped one, and may be linear electric wiring as described later. In this case, the diamond element may be disposed on the surface or an end of the transmission path (e.g., the conductive member) for transmitting electromagnetic waves (e.g., microwaves or millimeter waves). Accordingly, the NV center of the diamond can be accurately irradiated with electromagnetic waves.

Preferably, in a case of detecting temporal change in varying magnetic field and the like with respect to AC power using the diamond sensor unit described above, the NV center of the diamond element is excited and subsequently returns from the light radiating state to the original state (i.e., the state before excitation). To achieve this, it is preferable that spin coherence time T2 of the diamond element be short. Preferably, for example, spin coherence time T2 of the diamond element is less than 50 sec. Note that the detection sensitivity is proportional to $(T2)^{-1/2}$. Accordingly, the smaller T2 is, the lower the detection sensitivity is. Consequently, when abrupt change in magnetic field variation is detected, for example, when pulse shape variation in magnetic field is detected, it is conceivable that spin coherence time T2 of the diamond element is made short as much as possible at the expense of the detection sensitivity.

Preferably, to reduce the spin coherence time, the diamond element contains impurities. In consideration of the fact that the smaller T2 is, the lower the detection sensitivity is, for example, it is preferable that the total hydrogen concentration in the diamond is higher than 0 ppm, and 1 ppm or less. Preferably, all the $NVH^-$ concentration, CH concentration and $CH_2$ concentration in the diamond are higher than 0 ppm and 1 ppm or less. Here, the concentration (ppm unit) represents the ratio of the number of atoms.

Example 1

Figure 11:
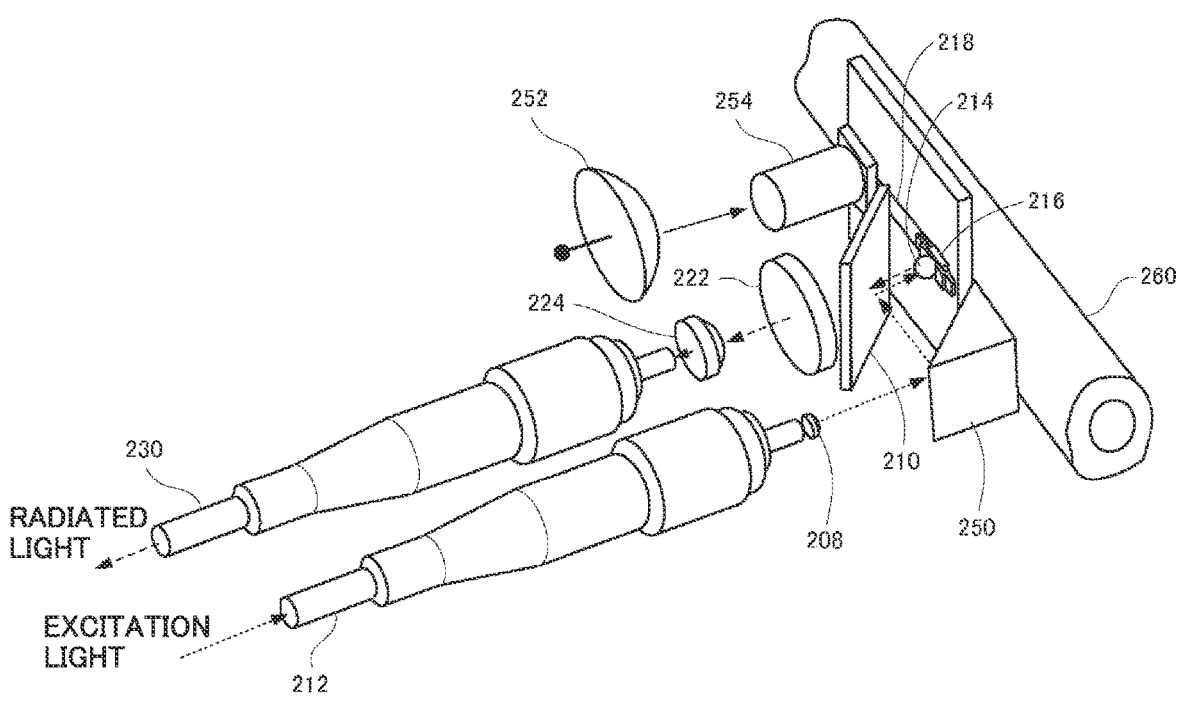
FIG. 11 is a perspective view showing an Example of the second embodiment (see FIG. 5).

Hereinafter, according to an Example, the effectiveness of the present disclosure is described. FIG. 11 shows the Example of the configuration shown in FIG. 5. In FIG. 11, components corresponding to the configuration elements shown in FIG. are respectively assigned with symbols identical to those in FIG. 5.

Step-index multimode optical fibers are used as first optical waveguide 212 and second optical waveguide 230. First optical waveguide 212 has a core diameter of 50 μm, and an NA (i.e., numerical aperture) of 0.2. Second optical waveguide 230 has a core diameter of 400 μm, and an NA of 0.5. A rectangular parallelepiped diamond of 3 mm×3 mm×0.3 mm is used as diamond element 216. A spherical lens having a diameter of 2 mm is used as light collecting element 214. Light collecting element 214 is brought into contact with a surface (i.e., a flat surface of 3 mm×3 mm) of diamond element 216 and is fixed. In the optical system for transmitting the excitation light, a triangular prism 250 is disposed in addition to light collecting element 208 and fluorescent light reflection filter 210, thus configuring a collimating optical system. Thus, adjustment is performed so that the excitation light can enter the center of light collecting element 214.

Figure 12:
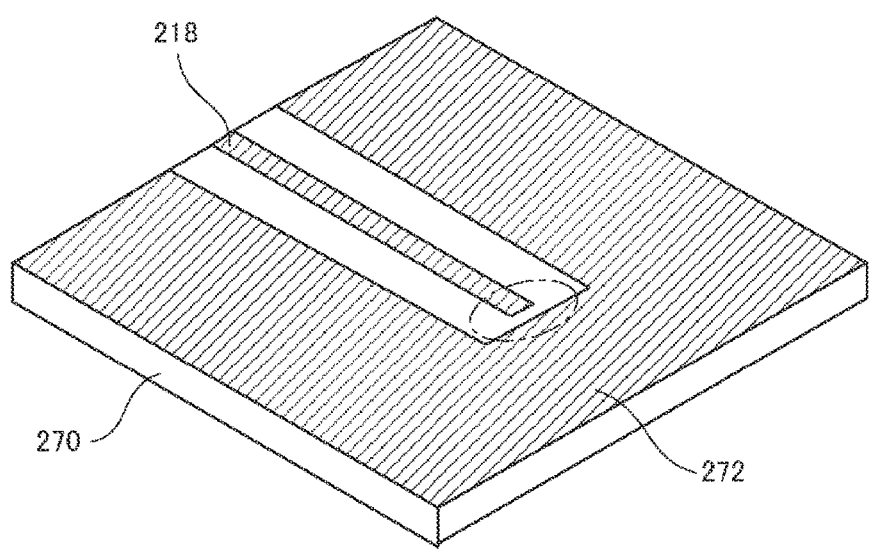
FIG. 12 is a perspective view showing an electromagnetic wave irradiation part that includes a coplanar line.

The coplanar line shown in FIG. 12 is used as electromagnetic wave irradiation part 218. A U-shape is cut out from copper foil 272 formed on a surface of a glass epoxy substrate 270 with each side of about 2 cm, thus forming, at the center, electromagnetic wave irradiation part 218 that is the main wiring having a width of 1 mm. Diamond element 216 is fixed with silver paste at one end (i.e., a region indicated by a chain-line ellipse in FIG. 12) of electromagnetic wave irradiation part 218. Accordingly, the NV center of diamond element 216 can be accurately irradiated with microwaves. The other end of electromagnetic wave irradiation part 218 (i.e., the end where no diamond element 216 is disposed) is in contact with a connector 254 in FIG. 11.

Figure 13:
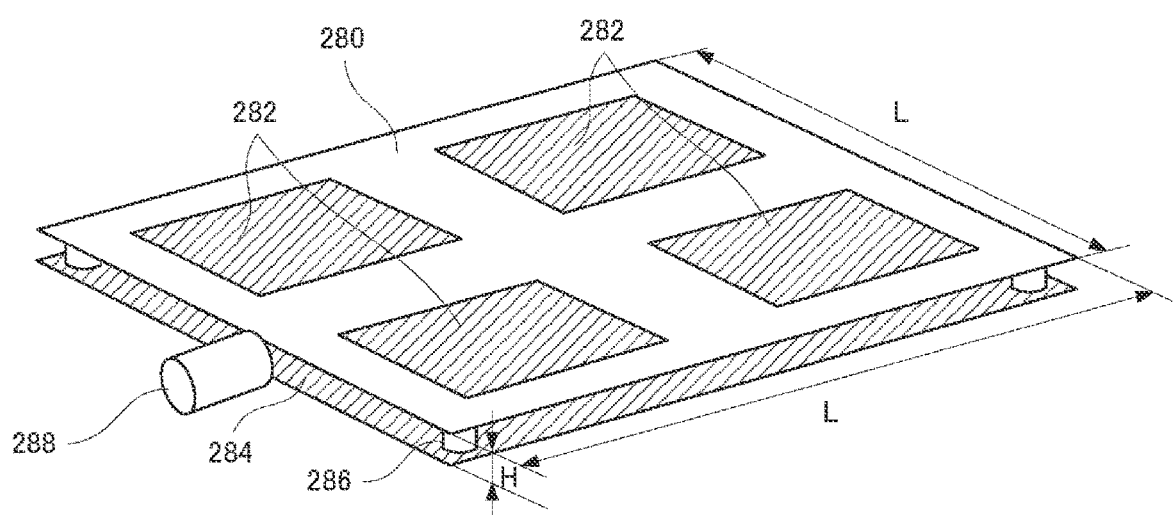
FIG. 13 is a perspective view showing a patch antenna that receives microwaves.

The microwaves are generated by a remotely provided microwave generation device, are transmitted in the air, and received by an antenna 252 (see FIG. 11). To radiate microwaves into the air, a horn antenna (gain of 10 dB) is used, A patch antenna (a frequency of 2.873 GHz, and a maximum gain of about 10 dBi) shown in FIG. 13 is used as antenna 252. The patch antenna includes substrates 280 and 284, and a connector 288 for outputting a received signal. Substrates 280 and 284 are arranged at an interval H (H=5.2 (mm)) with spacers 286 at four corners. Each of substrates 280 and 284 is a substrate made of a glass epoxy resin (e.g., FR4), and has a thickness of 1 min, and has a flat surface that is a square (the length L of one side is 120 mm). Four conductive members 282 are arranged on a surface of substrate 280 that does not face substrate 284. A conductive member is disposed on the entire surface of substrate 284 (hereinafter called the ground surface) that faces substrate 280. Four conductive members 282 are connected to a signal line of connector 288 in parallel. The ground surface of substrate 284 is connected to a shield (i.e., ground) of connector 288. Microwaves received by antenna 252 are transmitted to connector 254 through a transmission path (i.e., a coaxial cable), and are irradiated to diamond element 216 from electromagnetic wave irradiation part 218.

A PIN-AMP (i.e., a photodiode IC including a linear current amplifier circuit) is used as light detection part 226. The PIN-AMP used here has a photodiode sensitivity wavelength range of 300 to 1000 nm and a maximum sensitivity wavelength of 650 nm, and amplifies the photocurrent generated by the photodiode by 1300 times, and outputs the amplified signal.

Light collecting element 214, diamond element 216, and electromagnetic wave irradiation part 218, which constitute the sensor part, are disposed adjacent to electrical wiring 260. An alternating current (50 Hz or 60 Hz, and 30 A) is caused to flow through electrical wiring 260. The thus caused varying magnetic field is adopted as a, detection target. The maximum value of the magnetic field formed at the sensor part by the alternating current is about 0.3 μT. The power of microwaves radiated from the horn antenna is made constant (30 dBm (=1 W)), the distance D between the sensor part and the horn antenna that radiates microwaves is changed, and measurement is performed. The results are shown in FIGS. 14A to 14C and 15.

Figure 14A:
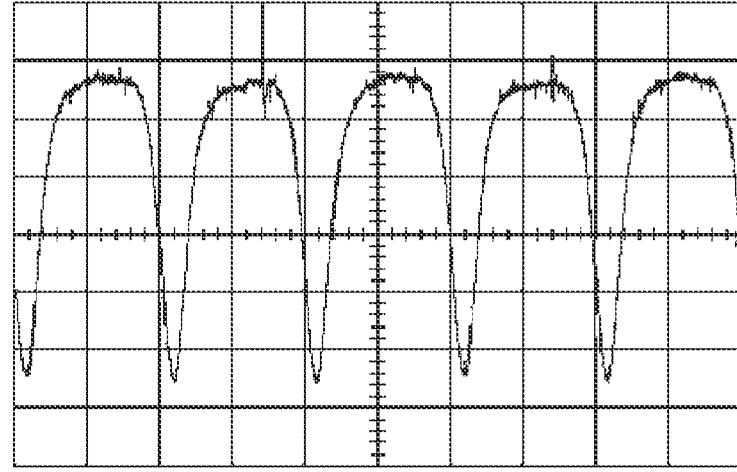
FIG. 14A is a graph showing an experimental result.
Figure 14B:
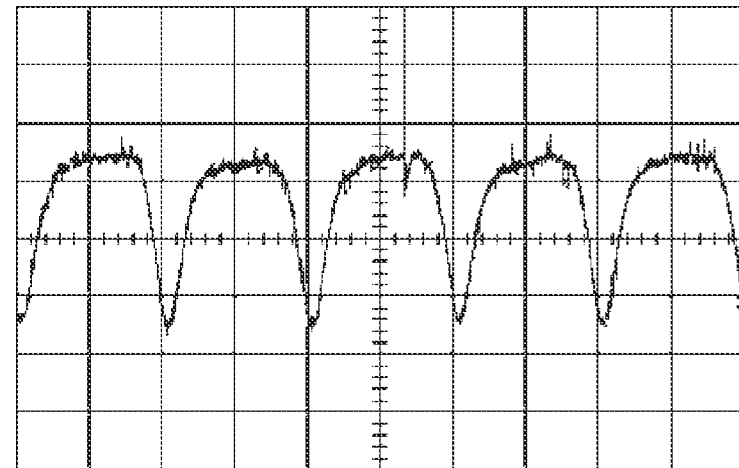
FIG. 14B is a graph showing an experimental result.
Figure 14C:
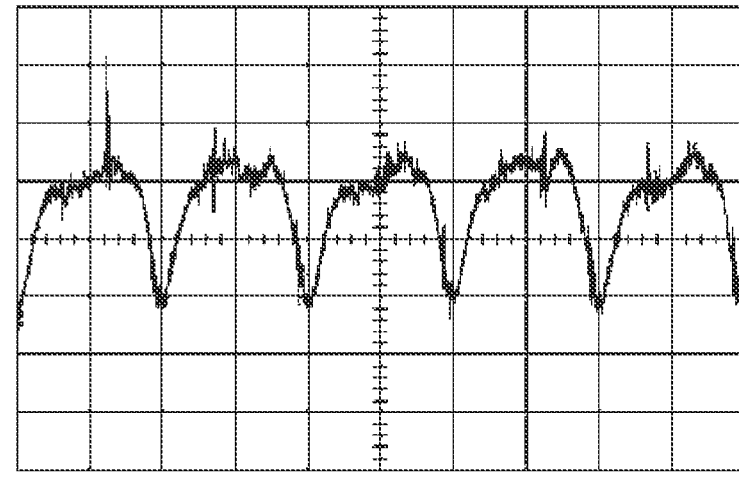
FIG. 14C is a graph showing an experimental result.
Figure 15:
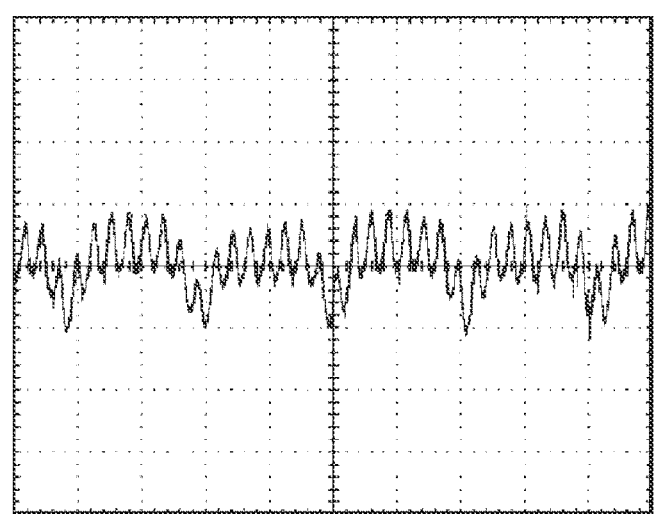
FIG. 15 is a graph showing an experimental result.

FIGS. 14A to 14C show the signals detected by the PIN-AMP in a state where a 50 Hz alternating current (30 A) is caused to flow through electrical wiring 260. FIGS. 14A to 14C show measurement results with D=2.8 (m), D=4 (m), and D=5 (m), respectively. In each of them, a scale on the ordinate axis indicates 10.0 mV, and a scale on the abscissa axis indicates 5 ms. FIG. 15 shows the signal detected by the PIN-AMP in a state where a 60 Hz alternating current (30 A) is caused to flow through electrical wiring 260, and D=10 (m). A unit scale on the ordinate axis indicates 10.0 mV, and a unit scale on the abscissa axis indicates 4 ms.

As can be seen in FIGS. 14A to 14C and 15, the detected signal decreases with increase in distance D of microwave radiation. However, even when relatively weak microwaves of about 1 W were radiated from a position apart from the sensor part by about 10 m, the change in magnetic field formed by the alternating current were sufficiently detected. The detection signals shown in FIGS. 14A to 14C vary at the AC frequency of 50 Hz. The detection signal shown in FIG. 15 varies at the AC frequency of 60 Hz. While the microwaves are attenuated depending on the distance, the power of microwaves to be radiated, the gain of radiation antenna, the gain of reception antenna and the like may be adjusted in consideration of the detection limit (i.e., the lower limit value of the power) of the adopted light detection part, and the radiation distance.

In the above description, the coplanar line is formed on the substrate with each side of about 2 cm. Alternatively, a rectangular substrate with each side of about 5 cm or less.

Figure 16:
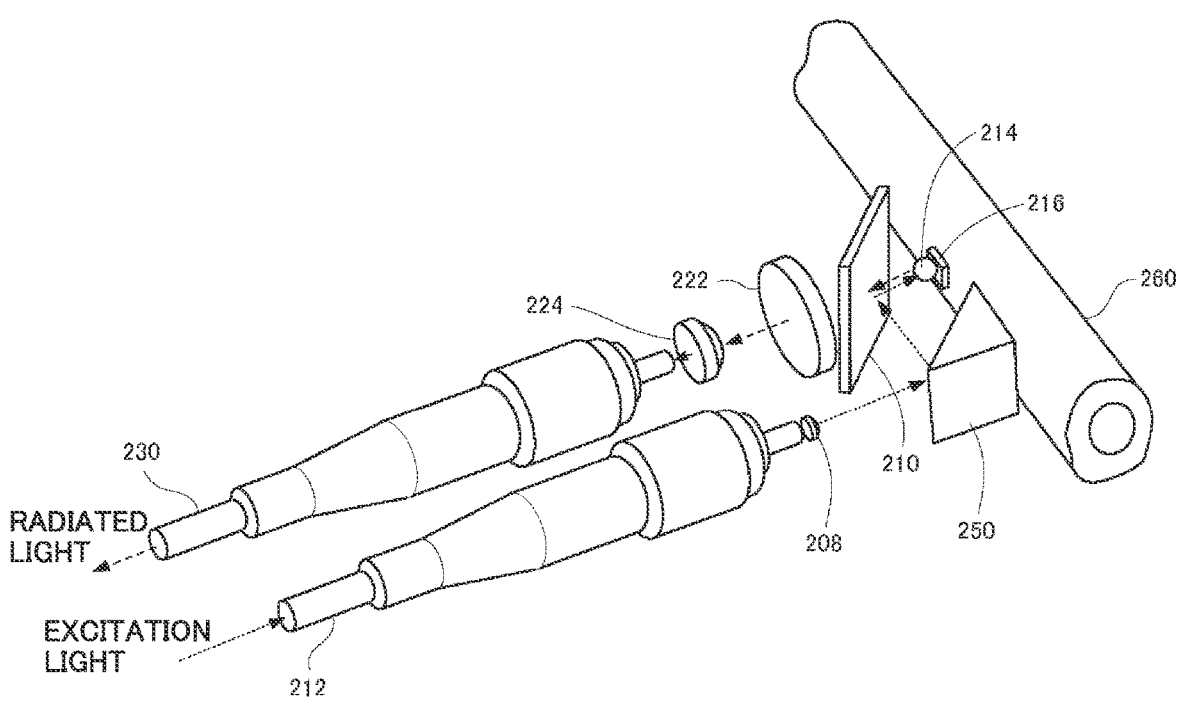
FIG. 16 is a perspective view showing an Example having the configuration shown in FIG. 10.

As shown in the third modification to the fifth modification (see FIGS. 8 to 10), the magnetic field can be detected even without irradiation of the diamond element with electromagnetic waves (e.g., microwaves etc.). For example, as shown in FIG. 16, the diamond sensor unit may be configured by removing the elements for irradiation with microwaves (i.e., electromagnetic wave irradiation part 218, antenna 252, connector 254, etc.) from the configuration of Example shown in FIG. 11. Also in this case, the varying magnetic field generated by the alternating current caused to flow through electrical wiring 260 can be detected.

Light collecting element 214 was disposed apart from the surface of diamond element 216 by 0.1 mm and thus was made contactless, and the other conditions were the same as the experiment conditions with D=2.8 m described above, i.e., the experiment conditions with which the signal in FIG. 14A was observed, and the experiment was performed. As a result, the signal intensity became less than ¹⁄₁₀ of the detection limit, and the observation was unsuccessful. It is conceivable that the density of excitation light decreased, and the fluorescent light intensity was not concentrated, and the signal intensity became less than ¹⁄₁₀. Note that the signal intensity means the difference between the maximum value and the minimum value of the values on the ordinate axis in FIG. 14A obtained by averaging the noise portion.

The core diameter of first optical waveguide 212 was 1 µm, and the core diameter of second optical waveguide 230 was changed to 0.9 µm, 1 µm, 25 µm, 50 µm, 80 µm, 400 µm, and 800 µm, and the experiment was performed. The other conditions were made the same as the aforementioned experiment conditions with D=2.8 m, i.e., the experiment conditions with which the signal in FIG. 14A was observed. As a result, the signal intensity (i.e., fluorescent light intensity) was less than 0.1 times of the signal intensity in FIG. 14A as a reference value (e.g., one), was 0.5 times, 1.2 times, 1.6 times, 1.8 times, 1.9 times, and twice. That is, except the case where the core diameter of second optical waveguide 230 was 0.9 µm, the signals were successfully detected. As the core diameter of second optical waveguide 230 increased, the detection signal increased accordingly. Note that in the case where the core diameter of second optical waveguide 230 was 1.2 mm was not successfully accommodated in a compact experiment system. As a result of similar experiments performed for the other modifications using first optical waveguide 212 and second optical waveguide 230, ratios substantially similar to those described above about the detected signal intensity were obtained.

The core diameter of first optical waveguide 212 was 80 µm, and the core diameter of second optical waveguide 230 was changed to 50 µm, 80 µm, 105 µm, 400 µm, and 800 µm, and the experiment was performed. The other conditions were made the same as the aforementioned experiment conditions with D=2.8 m, i.e., the experiment conditions with which the signal in FIG. 14A was observed. As a result, the signal intensity (i.e., fluorescent light intensity) was less than 0.1 times of the signal intensity in FIG. 14A as a reference value (e.g., one), was 0.3 times, 0.6 times, 0.75 times, and 0.8 times, That is, except the case where the core diameter of second optical waveguide 230 was 50 µm, the signals were successfully detected. As the core diameter of second optical waveguide 230 increased, the detection signal increased accordingly. Note that in the case where the core diameter of second optical waveguide 230 was 1.2 mm was not successfully accommodated in a compact experiment system. As a result of similar experiments performed for the other modifications using first optical waveguide 212 and second optical waveguide 230, ratios substantially similar to those described above about the detected signal intensity were obtained.

The present disclosure has thus been described above by describing the embodiments. The aforementioned embodiments are only examples. The present disclosure is not limited to only the embodiments described above. The scope of the present disclosure is indicated by each claim among the claims in consideration of the representation of the detailed description of the invention, and encompasses the meanings equivalent to the words described therein, and all the changes within the scope.

REFERENCE SIGNS LIST

100, 200, 300, 400, 500, 600, 700 Diamond sensor unit
102, 202 Light emitting element
104, 114, 124, 204, 208, 214, 224, 404, 406 Light collecting element
106, 206 Excitation light generation part
110, 210 Fluorescent light reflection filter
112 Optical waveguide
116, 216, 402 Diamond element
118, 218 Electromagnetic wave irradiation part
120, 220, 408, 502, 602, 702 Sensor part
122, 222, 908 LIT
126, 226 Light detection part
128, 228 Light receiving part
140 Electromagnetic wave generating part
142 Control part
212 First optical waveguide
230 Second optical waveguide
250 Triangular prism
252 Antenna
254, 288 Connector
260 Electrical wiring
270 Glass epoxy substrate
272 Copper foil
280, 284, 912, 914, 916 Substrate
282 Conductive member
286 Spacer
302 Excitation light reflection filter
900 LED
902 SPF
904 Diamond
906 Lens
910 Photodiode
H Interval
L Length

The invention claimed is:
1. A diamond sensor unit, comprising:
a sensor part that includes a diamond having a color center with electron spin;
an irradiation part configured to irradiate the diamond with excitation light;
a detection part configured to detect radiated light from the color center of the diamond; and
an optical waveguide configured to transmit the excitation light and the radiated light,
wherein the sensor part includes a light collecting element disposed between the diamond and the optical waveguide, the light collecting element configured to converge at least the excitation light output from the optical waveguide and irradiate the diamond with the converged excitation light,
wherein the optical waveguide includes a first optical waveguide configured to transmit the excitation light and a second optical waveguide configured to transmit the radiated light from the diamond, one end of the first optical waveguide is disposed closer to the diamond than another end of the first optical waveguide, one end of the second optical waveguide is disposed closer to the diamond than another end of the second optical waveguide, and a fluorescent light reflection filter, an LPF, or a dichroic mirror that separates the excitation light and the radiated light from each other is included within a predetermined distance from each of the one end of the first optical waveguide and the one end of the second optical waveguide.

2. The diamond sensor unit according to claim 1, wherein the sensor part includes a light collecting element that collects the excitation light and the radiated light.

3. The diamond sensor unit according to claim 2, wherein the light collecting element is a spherical lens formed on a silicon oxide basis or a Fresnel lens formed on a silicon oxide basis, and the optical waveguide is an optical fiber having a core diameter of 1 μm or more and 80 μm or less.

4. The diamond sensor unit according to claim 1, wherein the optical waveguide is disposed via at least an inside of a piece of insulating glass.

5. The diamond sensor unit according to claim 1, wherein the optical waveguide includes one medium that transmits the excitation light and the radiated light, and a fluorescent light reflection filter, an LPF, or a dichroic mirror that separates the excitation light and the radiated light from each other is included within a predetermined distance from one end positioned more remote from the diamond between both ends of the optical waveguide.

6. The diamond sensor unit according to claim 1, wherein the first optical waveguide includes a first optical fiber, the second optical waveguide includes a second optical fiber, and a core diameter of the second optical fiber is larger than a core diameter of the first optical fiber.

7. The diamond sensor unit according to claim 6, wherein the core diameter of the first optical fiber is 1 μm or more and 100 μm or less, and the core diameter of the second optical fiber is 1 μm or more and 1 mm or less.

8. The diamond sensor unit according to claim 1, wherein the diamond has a plurality of flat surfaces, the excitation light enters a first flat surface among the plurality of flat surfaces, and the detection part detects the radiated light emitted from a second flat surface that is other than the first flat surface among the plurality of flat surfaces.

9. The diamond sensor unit according to claim 1, wherein the sensor part that includes the diamond is entirely formed of an electrical insulating member.

10. The diamond sensor unit according to claim 1, wherein the diamond is disposed on a transmission line that transmits microwaves or millimeter waves, and the sensor part functions as a magnetic sensor.

11. The diamond sensor unit according to claim 10, wherein the transmission line includes a main wiring disposed on a rectangular printed board having each side of 5 cm or less, and the diamond is disposed at one end of the main wiring.

12. The diamond sensor unit according to claim 1, wherein a spin coherence time of the diamond is less than 50 μsec.

13. The diamond sensor unit according to claim 1, wherein a total hydrogen concentration in the diamond is 1 ppm or less.

14. The diamond sensor unit according to claim 1, wherein each of NVH concentration, CH concentration and $CH_2$ concentration in the diamond is 1 ppm or less.

15. A diamond sensor system, comprising:

the diamond sensor unit according to claim 10;

an electromagnetic wave generating part that generates the microwaves or the millimeter waves; and a control part that controls the irradiation part, the detection part and the electromagnetic wave generating part, wherein the control part irradiates the diamond with the excitation light, and the microwaves or the millimeter waves in a temporally and spatially combined manner.

16. A diamond sensor unit, comprising:

a sensor part that includes a diamond having a color center with electron spin;

an irradiation part configured to irradiate the diamond with excitation light;

a detection part configured to detect radiated light from the color center of the diamond; and an optical waveguide configured to transmit the excitation light and the radiated light, wherein the sensor part includes a light collecting element disposed between the diamond and the optical waveguide, the light collecting element configured to converge at least the excitation light output from the optical waveguide and irradiate the diamond with the converged excitation light, wherein the optical waveguide includes a first optical waveguide configured to transmit the excitation light and a second optical waveguide configured to transmit the radiated light; and a fluorescent light reflection filter, an LPF, or a dichroic mirror configured to:

pass the excitation light from the first optical waveguide to irradiate the diamond, and reflect the radiated light from the diamond into an end portion of the second optical waveguide.

* * * * *